(12) United States Patent
Furuyama et al.

(10) Patent No.: US 7,759,781 B2
(45) Date of Patent: Jul. 20, 2010

(54) LSI PACKAGE PROVIDED WITH INTERFACE MODULE

(75) Inventors: Hideto Furuyama, Yokohama (JP); Hiroshi Hamasaki, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 695 days.

(21) Appl. No.: 11/552,256

(22) Filed: Oct. 24, 2006

(65) Prior Publication Data

US 2007/0045868 A1 Mar. 1, 2007

Related U.S. Application Data

(62) Division of application No. 11/015,013, filed on Dec. 20, 2004, now Pat. No. 7,535,090.

(30) Foreign Application Priority Data

Dec. 26, 2003 (JP) ............... 2003-435836

(51) Int. Cl.
*H01L 23/48* (2006.01)
(52) U.S. Cl. .................. 257/685; 257/688; 257/698
(58) Field of Classification Search ........... 257/678, 257/685, 686, 688, 698
See application file for complete search history.

(56) References Cited

U.S. PATENT DOCUMENTS

2003/0164551 A1 9/2003 Lee et al.

2003/0168728 A1 9/2003 Hiruma
2004/0218372 A1 11/2004 Hamasaki et al.

FOREIGN PATENT DOCUMENTS

JP 6-52515 2/1994

OTHER PUBLICATIONS

"Investigation of an Optical Transmission Line such as an Optical Waveguide or Free-Space Optical Interconnection Advances", Nikkei Electronics, No. 810, pp. 121-122, Dec. 3, 2001, with partial English Translation.

*Primary Examiner*—Leonardo Andújar
(74) *Attorney, Agent, or Firm*—Oblon, Spivak, McClelland, Maier & Neustadt, L.L.P.

(57) ABSTRACT

A LSI package encompasses: an interposer having board-connecting joints, which facilitate connection with a printed wiring board, and module-connecting terminals, part of the module-connecting terminals are assigned as interposer-site monitoring terminals; a signal processing LSI mounted on the interposer; and an I/F module having a plurality of interposer-connecting terminals, which are arranged to correspond to arrangement of the module-connecting terminals, and a transmission line to establish an external interconnection of signal, which is transmitted from the signal processing LSI, part of the interposer-connecting terminals are assigned as module-site monitoring terminals. The interposer-site and module-site monitoring terminals are configured to flow a monitoring current to confirm electric contact between the signal processing LSI and the I/F module.

3 Claims, 14 Drawing Sheets

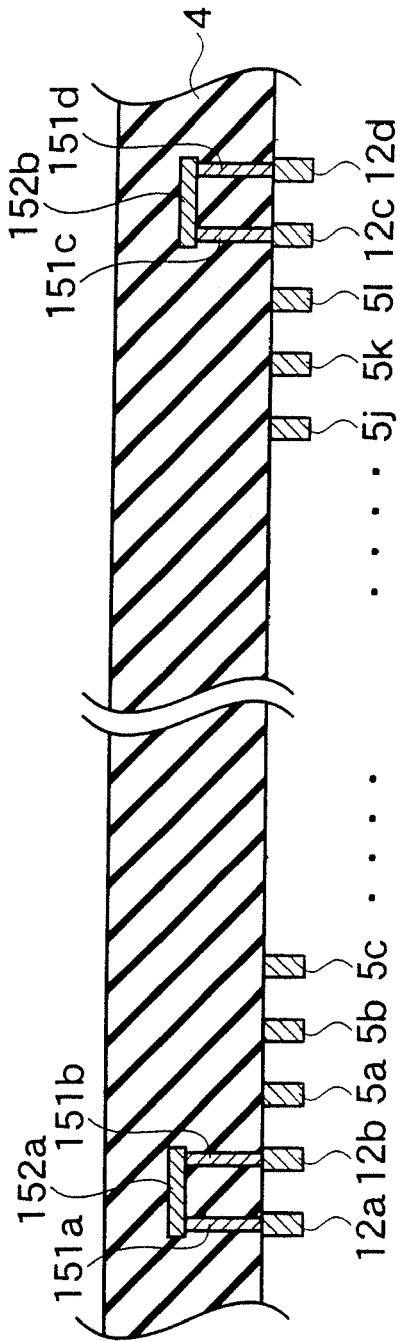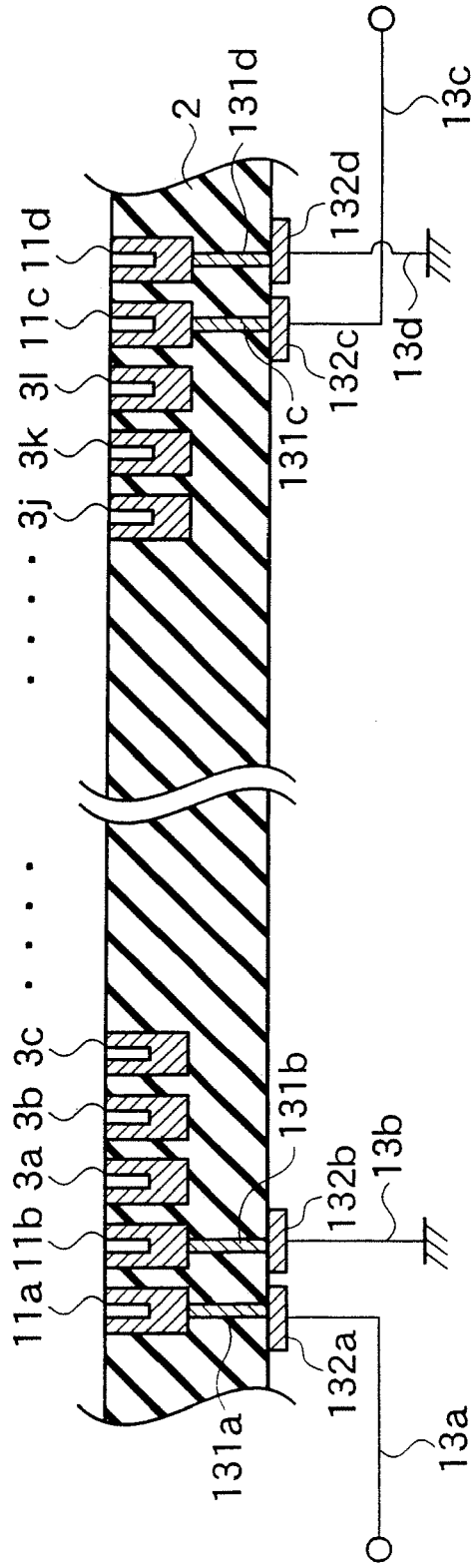
FIG. 4A
FIG. 4B

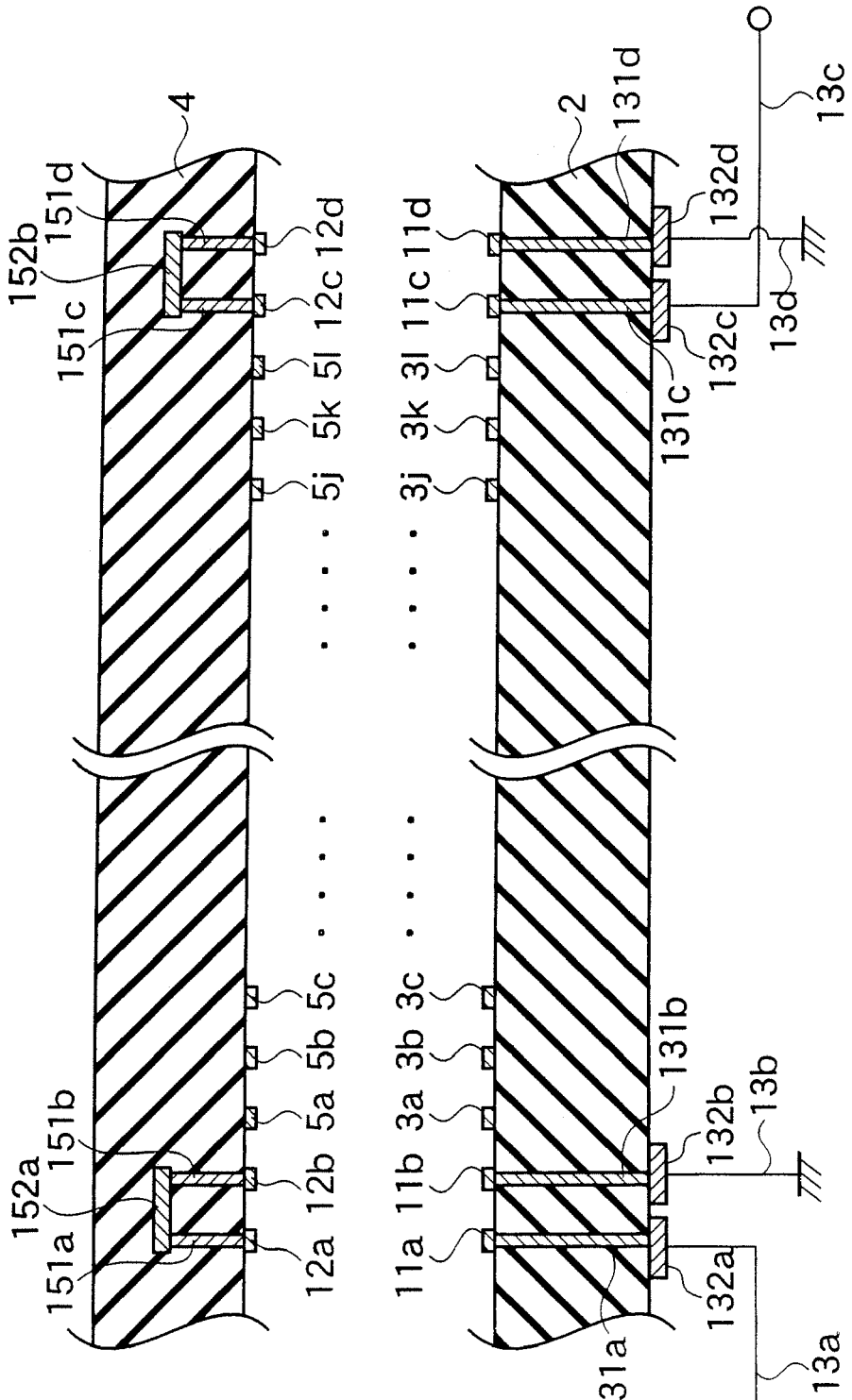

( 0 < Vref < Vcc/2 )

LSI PACKAGE PROVIDED WITH INTERFACE MODULE

CROSS REFERENCE TO RELATED APPLICATIONS AND INCORPORATED BY REFERENCE

This application is a divisional of and claims the benefit of priority under 35 USC §120 from U.S. Ser. No. 11/015,013, filed Dec. 20, 2004 and is based upon and claims the benefit of priority under 35 USC §119 from the Japanese Patent Application No. P2003-435836 filed Dec. 26, 2003, the entire contents of which are incorporated by reference herein.

BACKGROUND OF THE INVENTION

1. Field of the Invention

The present invention relates to an LSI package provided with an interface (I/F) module, an interposer and an I/F module which are used in the LSI package, a signal processing LSI mounted on the interposer so as to implement the LSI package, a monitoring circuit of the LSI package configured to monitor an electrical connection between the signal processing LSI and the I/F module.

2. Description of the Related Art

With improvements in performance of semiconductor active elements such as bipolar transistors and field-effect transistors, the remarkable developments of operation speed is attempted in large scale integrated circuits for signal processing (hereinafter described "signal processing LSI"). However, the operation speed on a board level, or a printed circuit board mounting the signal processing LSI, is still lower than the operation speed in the signal processing LSI, although the operation speed in the signal processing LSI is inherently high, and further, on a rack level packaging hierarchy implemented by the printed circuit boards, the operation speed becomes further lower. The above-mentioned operation speed problems are caused by increases in transmission loss, noise, and electromagnetic interference associated with the electrical interconnections, which increase more and more as the operation frequency becomes higher. Namely, it is inevitable that as the wiring length becomes long, the operating frequency decreases so as to ensure the signal quality. Therefore, such a tendency the packaging technology limits the operation speed of the system rather than the operation speed of the signal processing LSI, has become more and more significant recently in the electrically interconnected device.

Taking such problem in the electrically interconnected device into consideration, optically interconnected devices configured to establish communications between signal processing LSIs by optical interconnection are proposed. In the optical interconnection, since the frequency dependence of losses, the electromagnetic interference in the distribution lines and noise associated with ground potential fluctuation can be ignored in a frequency range from direct current to a high frequency band over 100 GHz, communication of Gbps can be easily realized. Such optically interconnected device establishing communications between signal processing LSIs by optical interconnection is disclosed, for instance, in NIKKEI ELECTRONICS, No. 810, pp 121-122, Dec. 3, 2001, in which an I/F module adapted for external connection of high-speed signals is directly mounted on an interposer, on which a signal processing LSI is mounted, is proposed.

In the above-mentioned earlier technology, it is difficult to mount an interposer on a board in an actual interposer mounting process, since the mounting of the interposer on the board is carried out in a condition where the interposer is mingled with the I/F module.

For instance, since the I/F module has an optical transmission line such as an optical fiber, etc, it is not possible to give heat treatment by putting the optical fiber into a solder reflow furnace of the interposer as it is. The problem is not limited to a case in which the optical transmission line is employed, since the same problem arises when an electrical transmission line such as a small coaxial cable is used for the transmission line.

Then, in NIKKEI ELECTRONICS, the optical transmission line is formed so that it can be detached from the I/F module by a detachable optical connector. However, in the detachable optical connector methodology, protectors for protecting optical semiconductor elements and optical connectors from mechanical damage and pollution are required. And, in addition, various architectures for lowering the process temperature so as to prevent thermal deformation of joints of the optical connector and for shortening the processing time are required. Because of these requirements, there was a problem being that the mounting condition of other parts which are supposed to be mounted on the same board does not meet with the mounting condition of the I/F module and that existing board assembly equipment are not able to be applied to as they are. Furthermore, the configuration becomes more and more complicated because pressure mechanism and holding mechanism of the optical connector must be provided in the detachable optical connector methodology, and the manufacturing cost drastically increases.

SUMMARY OF THE INVENTION

In view of these situations, it is an object of the present invention to provide an LSI package provided with an I/F module which can be manufactured through the existing production line and is not accompanied by extremely complicated configuration, and to provide an interposer and an I/F module which are used in the LSI package, a signal processing LSI mounted on the interposer so as to implement the LSI package, a monitoring circuit of the LSI package configured to monitor electrical connection between the signal processing LSI and the I/F module.

A feature of the present invention may inhere in a LSI package mountable on a printed wiring board, comprising: an interposer having a plurality of board-connecting joints, which facilitate connection with the printed wiring board, and a plurality of module-connecting terminals, part of the module-connecting terminals are assigned as first monitoring terminals and another part of the module-connecting terminals are assigned as first electric joints; a signal processing LSI mounted on the interposer; and an interface module having a plurality of interposer-connecting terminals, which are arranged to correspond to arrangement of the module-connecting terminals, and a transmission line to establish an external interconnection of signal, which is transmitted from the signal processing LSI, part of the interposer-connecting terminals are assigned as second monitoring terminals and another part of the interposer-connecting terminals are assigned as second electric joints, wherein the first and second monitoring terminals are configured to flow a monitoring current to confirm electrical connection between the signal processing LSI and the interface module.

Another feature of the present invention may inhere in an interposer included in an LSI package, the LSI package further including a signal processing LSI mounted on the interposer and an interface module having a transmission line configured to establish an external interconnection of signal, which is transmitted through the interposer, the interposer comprising: a plurality of module-connecting terminals configured to mechanically and electrically connect with a plurality of interposer-connecting terminals provided on the interface module, part of the module-connecting terminals are assigned as monitoring terminals, through which a monitoring current to confirm electrical connection between the module-connecting terminals and the interposer-connecting terminals flows.

Still another feature of the present invention may inhere in an interface module included in an LSI package, the LSI package further including a signal processing LSI and an interposer mounting the signal processing LSI, the interface module having a transmission line configured to establish an external interconnection of signal, which is transmitted through the interposer, the interface module comprising: a plurality of interposer-connecting terminals configured to mechanically and electrically connect with a plurality of module-connecting terminals provided on the interposer, part of the interposer-connecting terminals are assigned as monitoring terminals, through which a monitoring current to confirm electrical connection between the signal processing LSI and the interface module flows.

Yet still another feature of the present invention may inhere in a monitoring circuit of an LSI package including a signal processing LSI, an interposer mounting the signal processing LSI and an interface module having a transmission line configured to establish an external interconnection of signal, which is transmitted through the interposer, configured to monitor electrical connection between the signal processing LSI and the interface module, the monitoring circuit comprising: a conduction confirmation circuit configured to confirm the electrical connection by providing a first status signal when resistance in a current path from the signal processing LSI, through the interposer, to the interface module is smaller than a predetermined value, and a second status signal when the resistance is larger than the predetermined value.

Yet still another feature of the present invention may inhere in a monitoring circuit of an LSI package including a signal processing LSI, an interposer mounting the signal processing LSI and an interface module having a transmission line configured to establish external interconnection of a signal, which is transmitted through the interposer, configured to confirm electrical connection between the signal processing LSI and the interface module, the monitoring circuit comprising: a conduction confirmation circuit configured to confirm the electrical connection by providing a first status signal when a monitoring pulse provided by the signal processing LSI is returned through a current path from the signal processing LSI, through the interposer, to the interface module and a second status signal when the monitoring pulse is not returned from the current path.

Yet still another feature of the present invention may inhere in a signal processing LSI to be included in an LSI package, the LSI package further including an interposer mounting the signal processing LSI, an interface module having a transmission line configured to establish an external interconnection of signal, which is transmitted through the interposer, and a monitoring circuit configured to monitor electrical connection between the signal processing LSI and the interface module, the signal processing LSI comprising: a conduction confirmation circuit configured to confirm the electrical connection by providing a first status signal when the electrical connection in a current path from the signal processing LSI, through the interposer, to the interface module is normal, and a second status signal when the electrical connection is abnormal.

BRIEF DESCRIPTION OF THE DRAWINGS

FIG. 4A is a partial schematic cross-sectional view of an I/F module, taken on a rectangular ringed plane along an array of interposer-connecting terminals which are arranged in a rectangular topology around a rectangular window of FIG. 3;

FIG. 4B is a partial schematic cross-sectional view of an interposer, taken on a rectangular ringed plane along an array of module-connecting terminals which are arranged in a rectangular topology around a signal processing LSI of FIG. 2;

FIG. 8A is a partial schematic cross-sectional view of an I/F module, taken on a rectangular ringed plane along an array of interposer-connecting terminals which are arranged in a rectangular topology around a rectangular window of FIG. 7;

FIG. 8B is a partial schematic cross-sectional view of an interposer, taken on a rectangular ringed plane along an array of module-connecting terminals which are arranged in a rectangular topology around a signal processing LSI of FIG. 6;

DETAILED DESCRIPTION OF THE INVENTION

Figure 1:
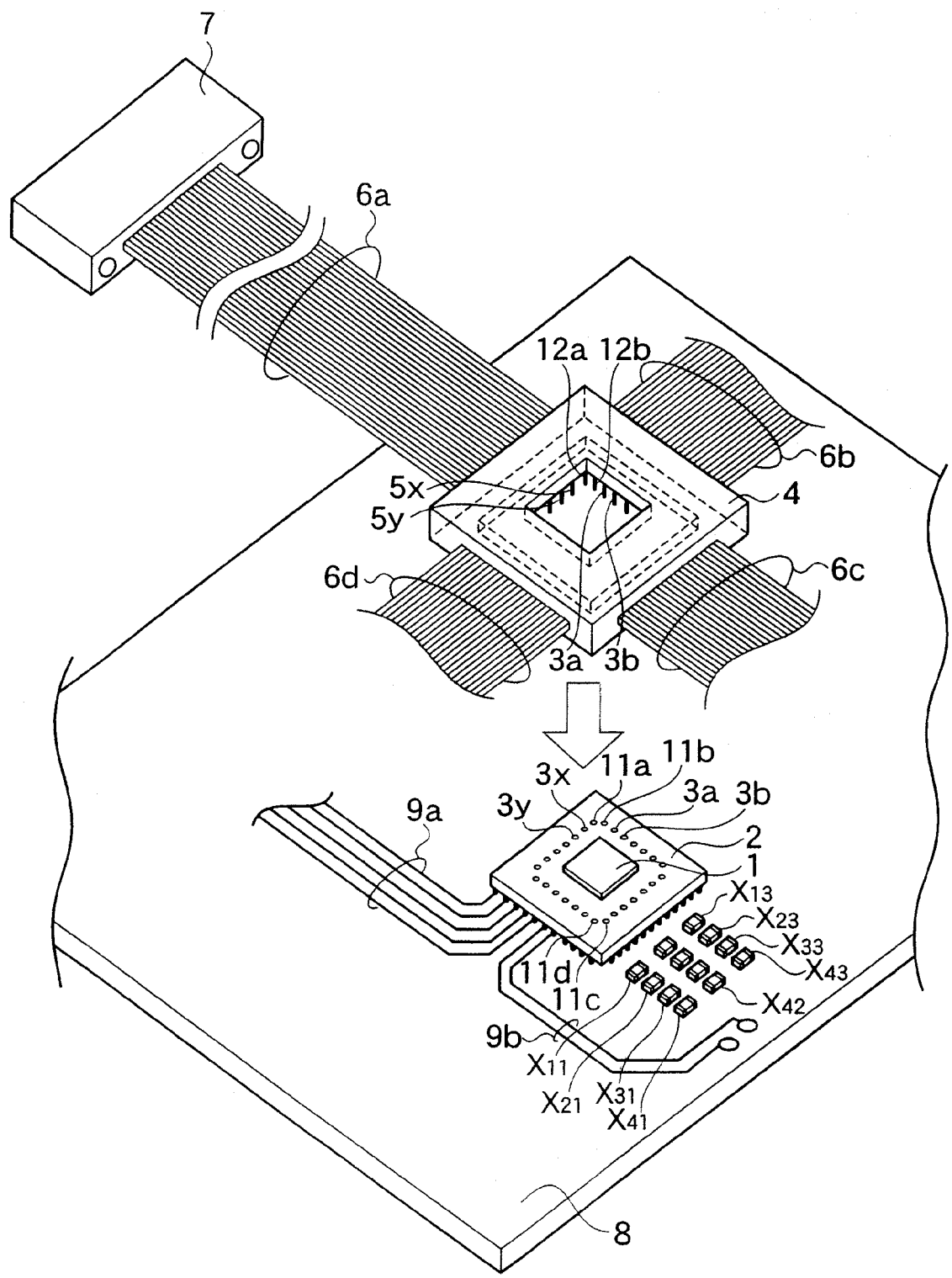
FIG. 1 is a schematic bird's-eye view illustrating a configuration of an LSI package provided with an I/F module according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

Figure 5A:
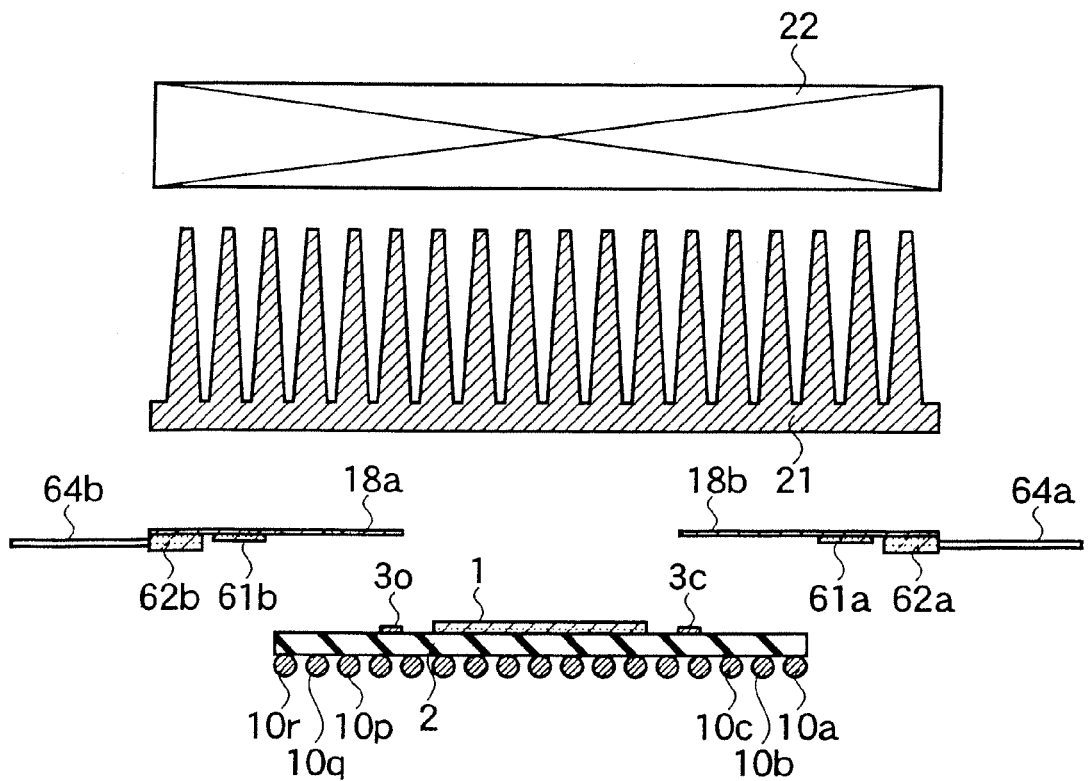
FIGS. 5A and 5B are schematic cross-sectional views showing the electrical connections between an interposer and an I/F module in an LSI package provided with an I/F module, which was described in U.S. patent application Ser. No. 10/778,030, the entire contents of which are incorporated by reference herein.

Before explaining various embodiments of the present invention, an LSI package provided with an I/F module proposed by inventors of the present invention in U.S. patent application Ser. No. 10/778,030, filed Feb. 17, 2004, the entire contents of which are incorporated by reference herein, will be explained by referring to FIG. 5A and FIG. 5B. U.S. patent application Ser. No. 10/778,030 shows an example using optical interconnections as external interconnections of a high-speed I/F module. In FIG. 5A, reference numeral 1 is a signal processing LSI, reference numeral 2 is an interposer, reference numerals 3c and 3o are connecting pads, reference numerals 10a, 10b, 10c, . . . 10r are solder balls, reference numerals 18a and 18b are circuit boards, reference numerals 61a and 61b are driving/receiving ICs, reference numerals 62a and 62b are electrical to optical (EO) or optical to electrical (OE) converters, reference numeral 21 is a heat sink and reference numeral 22 is a cooling fan. The high-speed signals from/to the signal processing LSI 1 are not supplied to/from the printed wiring board through the solder balls 10a, 10b, 10c, . . . 10r, but supplied to/from the driving/receiving ICs 61a, 61b through the connecting pads 3c, 3o and the circuit boards 18a, 18b. Then, the electrical signals are converted into optical signals or the optical signals are converted into electrical signals by the EO or OE converters 62a, 62b and are given to the optical fiber bundles 64a, 64b. Here, "interposer" is an element in an IC package, which connects a semiconductor chip to a motherboard, etc. The interposer may be implemented by lead frames, TAB tapes, resin substrates, etc.

Figure 5B:
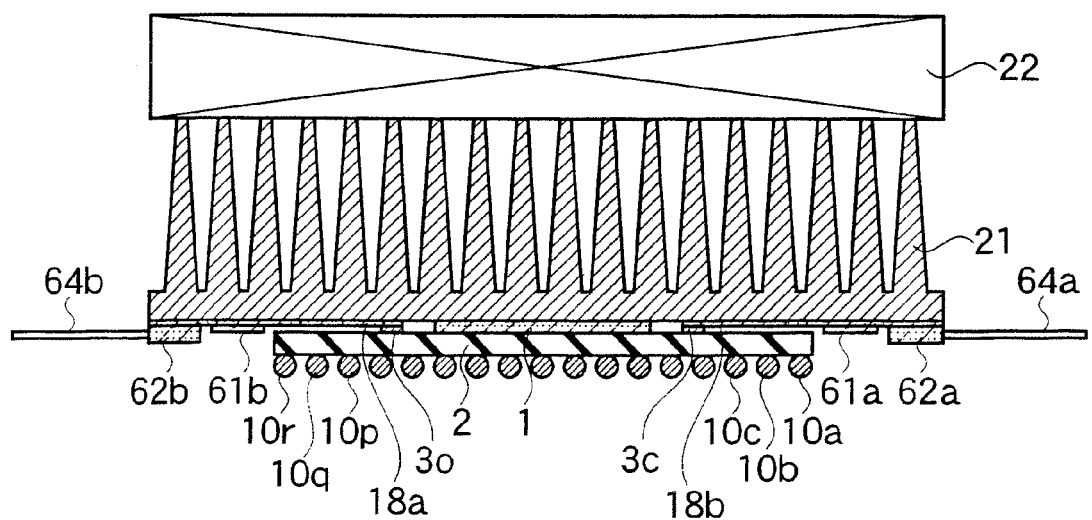

FIG. 5B schematically shows the completed configuration of the LSI package provided with the I/F module of FIG. 5A. On the interposer 2 mounting the signal processing LSI 1, the I/F module 4—which includes a combination of the circuit board 18a, 18b, the driving/receiving ICs 61a, 61b, the EO or OE converters 62a, 62b, and the optical fiber bundles 64a, 64b—is mounted. And further, the heat sink 21 and the cooling fan 22 are attached on the upper part of the I/F module 4. By the configuration shown in FIG. 5B, heat radiation of the signal processing LSI 1 is established. The LSI package provided with the I/F module having the above-mentioned configuration, can be assembled in completely the same procedure and condition as those of standard LSI packaging processes, which are carried out by existing packaging equipment (the reflow furnace, etc.), on the printed wiring boards manufactured by existing production lines. And only the process for fixing the I/F module to the interposer 2 from the top of the interposer 2—for instance, by screw or adhesive—becomes the characteristic work process for assembling the LSI package provided with the I/F module shown in FIG. 5B. However, since the process for fixing the I/F module to the interposer 2 is by putting the I/F module on top of the interposer 2, this does not need a high-precise position controlling technology (for instance, ±10 μm). That is, such position controlling accuracy for a general electrical connector is enough for the process for fixing the I/F module to the interposer 2, and the cost of the assembling process of the LSI package provided with the I/F module shown in FIG. 5B does not increase so much. Namely, even with the existing packaging method using existing low cost printed wiring boards (for instance, glass epoxy board, etc.), a high-speed interconnection—for instance, 20 Gbps, which generally can not be realized in usual board electrical interconnection—becomes possible.

In the process sequence for mass-producing such LSI packages, some products are often accompanied by failures. Concretely, a malfunction of the wiring board is caused by poor contact (poor connection) of electric joints between the I/F module and the interposer. Main causes of the above failure mode are ascribable to, for instance, poor mounting of the I/F module on the interposer such as incomplete insertion of the I/F module, etc. and contamination of dirt to the electric joint, etc. Although these failure-causes seldom happen and are relatively simple, and are usually possible to recover by re-mounting the I/F module on the interposer and by air gun blowing of the electric joint, it is desirable that poor contact (poor connection) of the electric joint should be detected immediately so as to quickly find out appropriate measures to counter these failure-causes, from the viewpoint of product reliability and quality control.

Therefore, following embodiments of the present invention propose an LSI package provided with an I/F module (hereinafter called "an LSI package"), which can solve the above-mentioned problem, adding an electric contact monitoring mechanism to the LSI package, the monitoring mechanism configured to monitor electric contact (electrical connection) between a signal processing LSI and an I/F module. The embodiments of the present invention also propose a monitoring circuit configured to monitor an electric contact between the signal processing LSI and the interface module, equivalently confirming the electric contact between the signal processing LSI and the interface module. The embodiments of the present invention further propose an input/output (I/O) controller configured to control transmission and reception of signals to and from the interface module, by blocking the signals when poor contact (poor connection) is detected in the current path provided in the LSI package.

Next, first to fifth embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor packages, it will be appreciated that the various drawings are not drawn to scale from one figure to another nor inside a given figure, and in particular that the layer thicknesses are arbitrarily drawn for facilitating the reading of the drawings.

In the following description, specific details are set forth, such as specific materials, the process and equipment in order to provide a thorough understanding of the present invention. It will be apparent, however, to one skilled in the art that the present invention may be practiced without these specific details. In other instances, well-known manufacturing materials, process and equipment are not set forth in detail in order not to unnecessary obscure the present invention. For instance, though in the description of the first to fifth embodiments, the example using an optical interconnection is shown as an external interconnection of the high-speed I/F module, an electrical interconnection such as a small coaxial cable array may be acceptable for the external interconnection. In the case where an external interconnection is an electrical interconnection, high-speed wiring interface IC such as a line driver IC and a line receiver IC can be mounted instead of the driving/receiving ICs and the optical devices, and if necessary, a pre-emphasis circuit and an equalizer, etc. may be contained. Prepositions, such as "on", "over" and "under" are defined with respect to a planar surface of the interposer, regardless of the orientation in which the interposer is actually held. A layer is on another layer even if there are intervening layers.

First Embodiment

Figure 2:
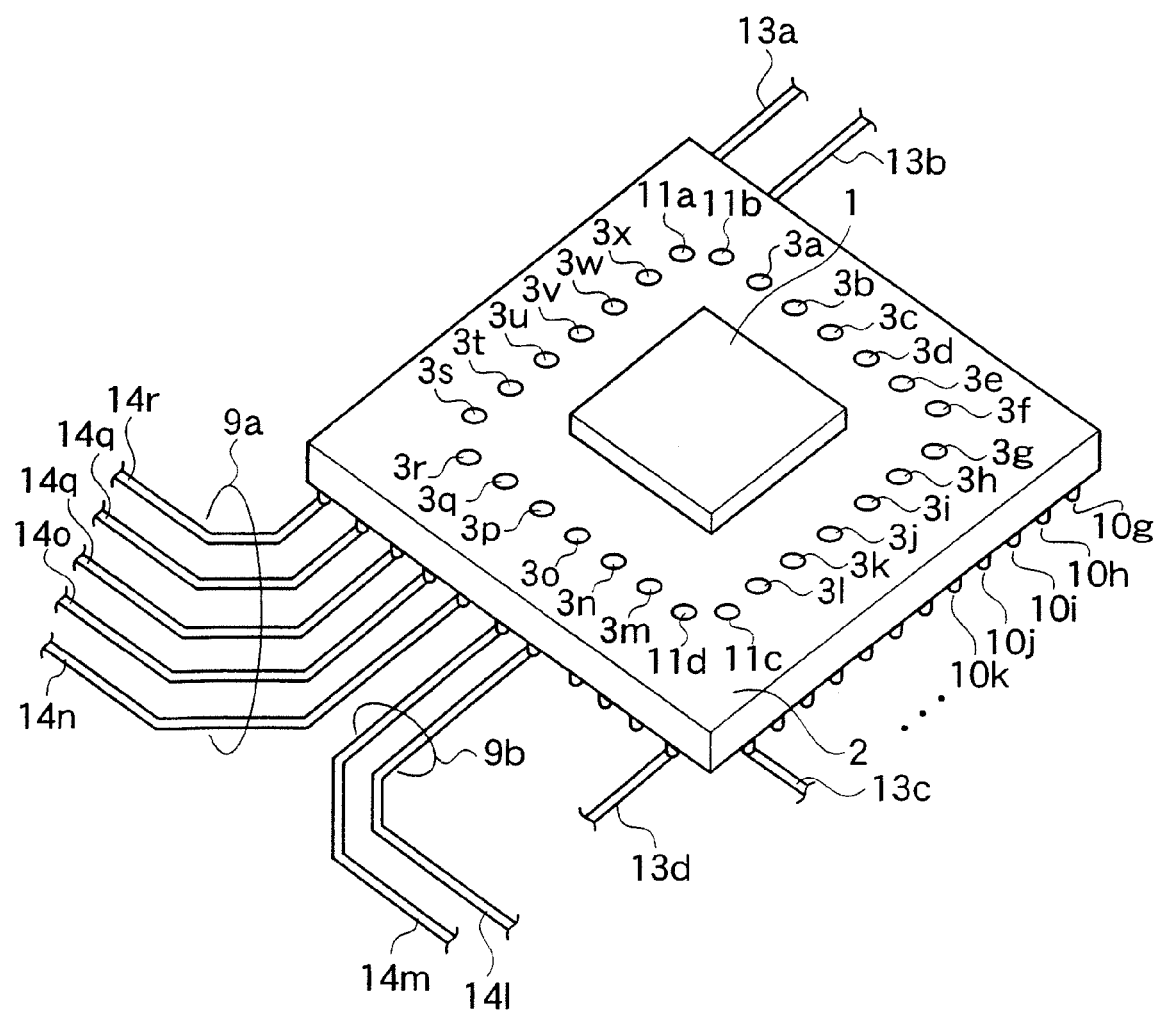
FIG. 2 shows an enlarged bird's-eye view of an interposer and configuration around the interposer.

As shown in FIG. 1, an LSI package according to a first embodiment of the present invention includes an interposer 2, a signal processing LSI 1, which is mounted on the interposer 2 and an I/F module 4, which is electrically connected with an interposer 2. The interposer 2 is employed to facilitate electrical connection between the signal processing LSI 1 and the printed wiring board 8 such that the interposer 2 can be connected to the printed wiring board 8 by electric joints. When the signal processing LSI 1 is taken as the zero-th packaging hierarchy level, "a first level package" is implemented by the signal processing LSI 1 and the interposer. And by mounting the I/F module 4 on "the first level package", the LSI package as "a second level package" is completed. In addition, "a third level package" is implemented by a combination of "the second level package" and the printed wiring board 8. The solder balls are shown in FIG. 2 as "board-connecting joints 10a, 10b, . . . 10r" for electrically connecting the interposer 2 with the printed wiring board. Though, as the interposer 2 according to the first embodiment, a ball grid array (BGA) package is illustrated, it can be acceptable to use a pin grid array (PGA) package and a land grid array (LGA) package, etc. instead of the BGA package. In addition, since the interposer 2 is one of the packaging elements configured to connect a semiconductor chip (the signal processing LSI) 1 to the motherboard (printed wiring board) 8 in the configuration of an IC package, a lead frame, a tape automated bonding (TAB) tape, or a resin substrate, etc. can be used as the interposer 2. Therefore, various organic based materials such as synthetic resin and inorganic based materials such as ceramic, glass, etc. can be acceptable for the substrate material of the interposer 2. Organic based materials may include phenol resin, polyester resin, epoxy resin, polyimide resin, fluorocarbon polymers, etc. Papers, woven glass fibers, or glass base materials, etc. are usable for a reinforcement base material serving as a core in a laminated slab configuration. A representative inorganic material for the substrate material is ceramic. Metallic substrates are used for the purpose of improving thermal dissipation characteristics of the interposer 2. And glass is used when a transparent substrate is necessary for the interposer 2. Alumina ($Al_2O_3$), mullite ($3Al_2O_3 \cdot 2SiO_2$), beryllia (BeO), aluminum nitride (AlN), silicon carbide (SiC), etc. are usable as ceramic substrates of the interposer 2. In addition, metal-based substrates (metal insulated substrates) having a multi-level structure, laminating heat-resistant resin films of the polyimide based material on metals such as iron and copper, may well be used for the interposer 2.

A plurality of module-connecting terminals (micro sockets) 3a-3x and 11a-11d are established in the interposer 2 to facilitate connection against the I/F module 4. And, corresponding to the arrangement of the module-connecting terminals (micro sockets) 3a-3x and 11a-11d, the arrangement of interposer-connecting terminals (micro pins) 5a-5x and 12a-12d are established in the I/F module 4. In the LSI package according to the first embodiment of the present invention, part of the module-connecting terminals (micro sockets) 3a-3x and 11a-11d and the interposer-connecting terminals (micro pins) 5a-5x and 12a-12d are assigned respectively as monitoring terminals configured to equivalently confirm the electric contact condition (electrical connection condition) between the signal processing LSI 1 and the I/F module 4. That is to say, an array of the module-connecting terminals 3a-3x and 11a-11d disposed in the interposer 2 are classified into two parts including interposer-site electric joints (first electric joints) 3a-3x and interposer-site monitoring terminals (first monitoring terminals) 11a, 11b, 11c, and 11d, while an array of the interposer-connecting terminals 5a-5x and 12a-12d placed in the I/F module 4 are classified into two parts including the module-site electric joints (second electric joints) 5a-5x and module-site monitoring terminals (second monitoring terminals) 12a, 12b, 12c and 12d.

The I/F module 4 has four aligned bundles of transmission lines 6a, 6b, 6c, and 6d for establishing external interconnection of signals (high-speed signals) which are transmitted through the interposer-site electric joints 3a-3x and the module-site electric joints 5a-5x. In FIG. 1, parallel fiber-ribbon cables implemented by a plurality of optical fibers are illustrated as the aligned bundle of transmission lines 6a, 6b, 6c and 6d. At the end of the aligned bundle of transmission lines (parallel fiber-ribbon cable) 6a, an optical connector 7 for connecting with an external aligned bundle of transmission lines (parallel fiber-ribbon cable), is shown. The other aligned bundles of transmission lines 6b, 6c and 6d are also connectable to external aligned bundles of transmission lines by the similar optical connectors. The aligned bundles of transmission lines 6a, 6b, 6c and 6d can be made by not only optical fibers but also optical waveguide films implemented by UV hardened epoxy resin, polyimide resin, or fluorocarbon polyimide resin, etc. In the optical waveguide films, a linear array of cores, each having a ridge structure with a cross-sectional dimension of around 50 $\mu m^\square$ for a multi-mode optical waveguide film 32, and around 9 $\mu m^\square$ for a single mode optical waveguide film 32, may be arranged in the inside of the optical waveguide film. In FIG. 1, though the structure where four aligned bundles of transmission lines 6a, 6b, 6c and 6d are extending along four directions of the I/F module 4 has been shown, a structure where three aligned bundles of transmission lines are taken out along three directions or less is also possible. And if the I/F module 4 is a polygonal shape over a pentagon, a structure in which a plurality of aligned bundles of transmission lines are taken out along a plurality of directions over five directions is also possible. Still, similar to the interposer 2, various materials of organic based materials including synthetic resin and inorganic based materials such as ceramic, glass are usable as a material of the I/F module 4.

Board wiring groups 9a and 9b are delineated on the printed wiring board 8, being connected to the board-connecting joints (solder balls) 10a, 10b, 10c, . . . 10r, which are adapted for facilitate electrical connection between the printed wiring board 8 and the interposer 2. The board wiring groups 9a and 9b may include power lines, control lines, etc. On the printed wiring board 8, a plurality of circuit components $X_{ij}$ (i=1-4; j=1-3) are mounted. FIG. 1 typically illustrates as if twelve identical chip capacitors are arranged, but circuit components $X_{ij}$ (i=1-4; j=1-3) can include various kinds of passive elements such as resistors and inductors, etc. And, as the circuit components $X_{ij}$, semiconductor active elements such as transistors, thyristors, diodes can be acceptable for use, and LSI chips, etc. may be included in the circuit components $X_{ij}$. In addition, the number of circuit components $X_{ij}$ is not limited to twelve, and the layout of the circuit components $X_{ij}$ may be randomly arranged.

With a hybrid integrated circuit implemented by the circuit components $X_{ij}$, a monitoring circuit configured to equivalently monitor electric contact (electrical connection) between the signal processing LSI 1 and the interface module 4 in the LSI package according to the first embodiment can be implemented on the printed wiring board 8. Furthermore, power supply circuits configured to supply voltages and/or currents to the monitoring circuit can be implemented on the printed wiring board 8 by the circuit components $X_{ij}$, accomplishing a hybrid integrated circuit. And, a display unit configured to display an abnormal connection when the abnormality was discovered in the electric contact, may be additively mounted on the printed wiring board 8. As the display unit, such a circuit, for instance, configured to turn on a red light emitting diode (LED) when a poor electric contact is detected and to turn on a green LED when a normal electric contact is detected, may be used. Therefore, LEDs, etc. can be also included in the circuit components $X_{ij}$ which are mounted on the printed wiring board 8 shown in FIG. 1.

FIG. 2 shows the enlarged bird's-eye view of the interposer 2 and the configuration around the interposer 2. The interposer is connected to board wirings 14l 14m, which implement the wiring group 9a, and board wirings 14n . . . 14r, which implement the wiring group 9b, on the printed wiring board 8 by the board-connecting joints (solder balls) 10a, 10b, . . . 10r for connecting the printed wiring board to the interposer 2. In addition, monitor wirings 13a, 13c and ground wiring 13b, 13d etc. disposed on the printed wiring board 8 are also shown. And FIG. 2 perspectively shows a configuration in which the interposer-site electric joints 3a-3x (micro sockets) are arranged so that the array of interposer-site electric joints 3a-3x surround the signal processing LSI 1 around the peripheral region of the interposer 2, on which the signal processing LSI 1 is mounted. FIG. 2 also shows a configuration in which four interposer-site monitoring terminals (micro sockets) 11a, 11b, 11c and 11d are assigned at two corners of a rectangular arrangement of the interposer-site electric joints 3a-3x. The topology shown in FIG. 2 corresponds to a structure in which a part of the ringed arrangement of the interposer-site electric joints 3a-3x is utilized (replaced) by the interposer-site monitoring terminals 11a, 11b, 11c and 11d.

Figure 3:
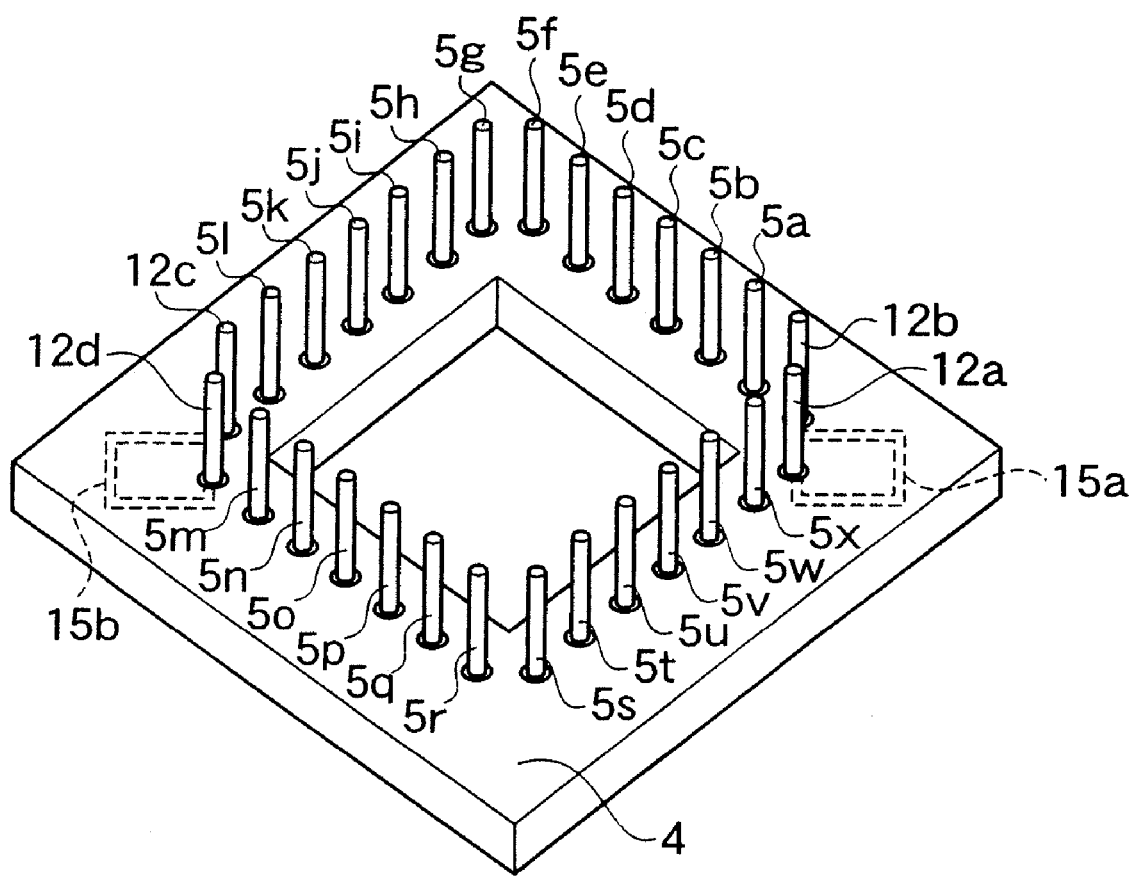
FIG. 3 is an enlarged bird's-eye view showing an I/F module implementing the LSI package of FIG. 1.

FIG. 3 is an enlarged bird's-eye view showing the I/F module 4 of FIG. 1. At the center of the I/F module 4, a rectangular window having the size in which the rectangular signal processing LSI 1 can be accommodated, when the I/F module 4 is mounted on the interposer 2, has been established. In the I/F module 4 shown in FIG. 3, an array of the module-site electric joints (micro pins) 5a-5x corresponding to the array of interposer-site electric joints (micro sockets) 3a-3x are established as a rectangular arrangement around the rectangular window. Then, the interposer 2 and the I/F module 4 are electrically connected through mechanical contact of the interposer-site electric joints 3a-3x with the corresponding module-site electric joints 5a-5x. Further, the module-site monitoring terminals (micro pins) 12a, 12b, 12c and 12d which correspond to the interposer-site monitoring terminals (micro sockets) 11a, 11b, 11c and 11d shown in FIG. 2, are established at the corners of the rectangular arrangement of the module-site electric joints (micro pins) 5a-5x. At the right side corner of the I/F module 4 shown in FIG. 3, a conductive path (short-circuit path) 15a, which electrically connects between the first module-site monitoring terminal 12a and the second module-site monitoring terminal 12b at low impedance, is shown. And a conductive path (short-circuit path) 15b which electrically connects between the third module-site monitoring terminal 12c and the fourth module-site monitoring terminal 12d is shown at the left side corner of the I/F module 4 shown in FIG. 3. The topology shown in FIG. 3 corresponds to a structure in which a part of the ringed arrangement of the module-site electric joints 5a-5x is utilized (replaced) by the module-site monitoring terminals 12a, 12b, 12c and 12d.

In the LSI package according to the first embodiment of the present invention, to perform operation of the monitoring circuit, it is enough for the LSI package to encompass at least one pair of the module-connecting terminals (micro sockets) mutually and electrically short-circuited among the module-connecting terminals (micro sockets) 3a-3x; 11a-11d on the interposer 2, or at least one pair of the interposer-connecting terminals (micro pins) mutually and electrically short-circuited among interposer-connecting terminals (micro pins) 5a-5x; 12a-12d on the I/F module 4. The pair of monitoring terminals is electrically connected as part of the monitoring circuit for equivalently confirming the electric contact condition between the signal processing LSI 1 and the I/F module 4. Therefore, FIG. 3 shows that a port between the first module-site monitoring terminal 12a and the second module-site monitoring terminal 12b on the I/F module 4 are electrically short-circuited by the conductive path (short-circuit path) 15a, and a port between the third module-site monitoring terminal 12c and the fourth module-site monitoring terminal 12d of the I/F module 4 are electrically short-circuited by the conductive path (short-circuit path) 15b. Also, at least one pair of the mutually and electrically short-circuited interposer-site monitoring terminals can be provided on the side of the interposer 2 for performing operation of the monitoring circuit in the LSI package according to the first embodiment of the present invention.

Each of the interposer-site monitoring terminals (micro socket) 11a, 11b, 11c and 11d shown in FIG. 2 and each of the corresponding module-site monitoring terminals (micro pins) 12a, 12b, 12c and 12d shown in FIG. 3 serve as contact monitors for equivalently confirming the electrical connection by mechanical contact of each of the interposer-site electric joints (micro sockets) 3a-3x with the corresponding module-site electric joints 5a-5x. The interposer-site electric joints (micro sockets) 3a-3x, the module-site electric joints 5a-5x, the interposer-site monitoring terminals (micro socket) 11a, 11b, 11c, 11d and the module-site monitoring terminals (micro pins) 12a, 12b, 12c, 12d can be made of metallic plates including aluminum (Al), copper (Cu), copper alloys such as Cu—Fe, Cu—Cr, Cu—Ni—Si, Cu—Sn, etc., ferronickel-alloys such as Ni—Fe, Fe—Ni—Co and composite material of copper and stainless steel, etc. In addition, these electric joints and monitoring terminals may be provided with nickel (Ni) plating and/or gold (Au) plating, etc. on these metallic materials. Concretely, an arrangement of a 1.27 mm pitch of brass pins coated with Ni plating, each pin having a 1 mm length at 0.5 mm$^\Phi$ diameter, are acceptable for the micro pins which implement the module-site electric joints 5a-5x and the module-site monitoring terminals 12a, 12b, 12c and 12d. And, the micro sockets used as the interposer-site electric joints 3a-3x and the interposer-site monitoring terminals 11a, 11b, 11c and 11d can adopt an arrangement of a 1.27 mm pitch of brass pipes coated with Ni plating, each of the pipes having a 1.5 mm depth at a 0.8 mm$^\Phi$ socket hole diameter, by cutting part of the brass pipe and pushing the cut part into the inner portion of the pipe so as to form a cantilever spring (the micro pin holding mechanism).

In the same configuration as FIGS. 5A and 5B, which discloses part of the invention stated in U.S. patent application Ser. No. 10/778,030, in the LSI package according to the first embodiment of the present invention, the optical fiber bundle 6d (aligned bundle of transmission lines) is inserted from the outside on the left of the I/F module 4 towards the inside of the I/F module 4, and the optical fiber bundle 6b (aligned bundle of transmission lines) is inserted from the outside on the right of the I/F module 4 towards the inside of the I/F module 4. Each core of the optical fiber in the optical fiber bundle 6d (aligned bundle of transmission lines) on the left side is precisely aligned and optically coupled with each of the active regions of the EO or OE converter array 62b (see FIGS. 5A and 5B) disposed in the left side of the inside of the I/F module 4. Similarly, each core of the optical fiber in the optical fiber bundle 6b (aligned bundle of transmission lines) on the right side is precisely aligned and optically coupled with each of the active regions of the EO or OE converter array 62a (see FIGS. 5A and 5B) disposed in the right side of the inside of the I/F module 4. Also, each core of the optical fiber in other optical fiber bundles 6a and 6c (aligned bundles of transmission lines) are precisely aligned and optically coupled with each of the active regions of the EO or OE converters (see FIGS. 5A and 5B) disposed in the right side of the inside of the I/F module 4.

As well as the configuration shown in FIGS. 5A and 5B, the EO or OE converter arrays 62a and 62b are connected to the driving/receiving ICs 61a and 61b by metallic wirings in the inside of the I/F module 4, and the driving/receiving ICs 61a and 61b are connected by metallic wirings to each of the module-site electric joints 5a 5b, 5d, . . . 5n, 5p, 5q, . . . 5x. The EO or OE converter arrays 62a and 62b, each having the structure in which a plurality of semiconductor lasers and photo-detectors, etc. are integrated in a semiconductor chip, are installed in the inside of the I/F module 4 so that the EO or OE converter arrays 62a and 62b can optically couple with each core of the optical fiber in the optical fiber bundles (aligned bundles of transmission lines) 6a, 6b, 6c, and 6d in the similar architecture shown in FIGS. 5A and 5B. Although illustration such as the detailed surface wirings is omitted, patterns of electrode wirings are drawn from the EO or OE converter arrays 62a and 62b, so as to facilitate electrical connection between the EO or OE converter arrays 62a and 62b and the driving/receiving ICs 61a and 61b. Otherwise, the driving/receiving ICs 61a and 61b can be built-in or integrated monolithically in the same chip of the EO or OE converter arrays 62a and 62b.

On the surface of the signal processing LSI 1, a plurality of signal input/output (I/O) terminals (bonding pads) are arranged, although the illustration was omitted. Similarly on the surface of the interposer 2, a plurality of lands are arranged. Then, each of these lands is mutually connected to the corresponding signal I/O terminals (bonding pads) arranged on the surface of the signal processing LSI 1 by solder bumps etc. In addition, the solder bump joints may be encapsulated by underfill resin. The underfill resin may be made of anisotropic conductive materials in which gold (Au), silver (Ag), nickel (Ni) or metallic powders such as titanium-nickel alloy (Ti—Ni) etc. are dispersed in insulating resins such as uretan resin and epoxy resin etc.

Though the illustration was omitted, the interposer 2 establishes a multi-level structure and inside of the multi-level structure of the interposer 2, buried interconnects serving as high-speed signal transmission lines are formed. Power supplies, ground lines and control signal lines at low-speed are also selectively delineated in the multi-level structure of the interposer 2 as buried interconnects. One end of each of the buried interconnects is connected to the lands arranged on the surface of the interposer 2 through via-plugs etc. penetrating the corresponding insulating layers in the multi-level structure of the interposer 2. The other end of each of the buried interconnects is connected to each of the interposer-site electric joints 3a, 3b, 3d, . . . 3n, 3p, 3q, . . . 3x. In this manner, each of the interposer-site electric joints 3a, 3b, 3d, . . . 3n, 3p, 3q, . . . 3x is electrically connected to each of the corresponding module-site electric joints 5a, 5b, 5d, . . . 5n, 5p, 5q, . . . 5x by mechanical contact. In addition, the interposer-site monitoring terminals 11a, 11b, 11c, and 11d shown in FIG. 2 are also electrically connected to the module-site monitoring terminals 12a, 12b, 12c and 12d shown in FIG. 3, thereby establishing mechanical contact mutually.

Similar to the cross-sectional view of FIGS. 5A and 5B, the high-speed signals from the signal processing LSI 1 are not supplied to the printed wiring board 8 through the board-connecting joints (solder balls) 10a, 10b, . . . 10r but are supplied to the driving/receiving ICs 61a and 61b through the interposer-site electric joints 3a-3x and the corresponding module-site electric joints 5a-5x in the LSI package of the first embodiment. And the electric signals are converted to the optical signals by the EO or OE converter arrays 62a and 62b and are given to parallel fiber-ribbon cables implemented by bundles of optical fibers (aligned bundles of transmission lines) 6a, 6b, 6c and 6d. According to the LSI package of the first embodiment of the present invention, by the same configuration shown in FIGS. 5A and 5B, though not illustrated in FIG. 1, it is possible to establish heat radiation of the signal processing LSI 1 when the heat sink 21 and the cooling fan 22 are attached on to the upper part of the I/F module 4.

The LSI package according to the first embodiment of the present invention shown in FIGS. 1 to 3 can be assembled in completely the same procedure and condition as those of the LSI packaging, which is carried out by existing packaging equipments (reflow furnace, etc.), on the printed wiring boards manufactured by existing production lines. Only the process for fixing the I/F module to the interposer 2 from the top of the interposer 2—for instance, by screw or adhesive—becomes the peculiar work for assembling the LSI package according to the first embodiment. Since the process for fixing the I/F module to the interposer 2 is by putting the I/F module on top of the interposer 2, it doesn't need a high-precise position controlling technology (for instance, ±10 μm). That is, such position controlling accuracy for a general electrical connector is enough for the process for fixing the I/F module to the interposer 2. So, the cost of the assembling process of the LSI package does not increase very much. Namely, even with the existing packaging method using existing low cost printed wiring boards (for instance, glass epoxy board, etc.), a high-speed board possessing high-speed interconnections becomes possible—for instance, 20 Gbps—which generally can not be realized in an usual board electrical interconnection.

The configuration and function of the interposer-site monitoring terminals 11a, 11b, 11c, 11d and the module-site monitoring terminals 12a, 12b, 12c, 12d, which are shown in FIGS. 1 to 3, will be explained with reference to FIGS. 4A and 4B. FIG. 4A is a schematic cross-sectional view of the I/F module 4, taken on a ringed plane perpendicular to the surface of the I/F module 4, the ringed plane running along the ringed array of the module-site electric joints 5a-5x, which are arranged in a rectangular topology around the rectangular window, and the module-site monitoring terminals 12a, 12b, 12c and 12d, which are assigned at two corners of a rectangular arrangement of the electric joints 5a-5x. Similarly, FIG. 4B is a schematic cross-sectional view of the interposer 2, taken on a ringed plane along the array of interposer-site electric joints 3a-3x which are arranged in a rectangular topology around the signal processing LSI 1 and the interposer-site monitoring terminals 11a, 11b, 11c and 11d which are assigned at two corners of a rectangular arrangement of the electric joints 3a-3x.

As shown in FIG. 4A, a port between the module-site monitoring terminal 12a and the module-site monitoring terminal 12b is electrically short-circuited by a conductive path (short-circuit path) 15a shown in FIG. 3 which is implemented by short-circuit via-plugs 151a, 151b and a buried interconnect 152a. Similarly, a port between the module-site monitoring terminal 12c and the module-site monitoring terminal 12d is electrically short-circuited by a conductive path (short-circuit path) 15b shown in FIG. 3 which is implemented by short-circuit via-plugs 151c, 151d and a buried interconnect 152b. On the other hand, the interposer-site monitoring terminal 11a on the left side of FIG. 4B is connected to the monitor wiring 13a through a monitoring via-plug 131a and a monitoring land 132a. The interposer-site monitoring terminal 11b is connected to a ground wiring 13b through a grounding via-plug 131b and a grounding land 132b. In addition, the interposer-site monitoring terminal 11c on the right side of FIG. 4B is connected to the monitor wiring 13c through a monitoring via-plug 131c and a monitoring land 132c. And the interposer-site monitoring terminal 11d is connected to a ground wiring 13d through a grounding via-plug 131d and a grounding land 132d.

In the configuration of FIGS. 4A and 4B, by connecting a voltage supply or a current supply to the monitor wiring 13a on the left side of FIG. 4B and by equivalently confirming the electric contact condition between the signal processing LSI 1 and the I/F module 4, the monitoring circuit can be established by a route from the monitor wiring 13a to the ground (GND) wiring 13b through the interposer-site monitoring terminal 11a, the module-site monitoring terminal 12a, the conductive path (short-circuit path) 15a, the module-site monitoring terminal 12b and the interposer-site monitoring terminal 11b. Namely, current is supplied to the monitoring circuit in the above-mentioned configuration where one pair of the interposer-site monitoring terminal 11a and the module-site monitoring terminal 12a are electrically connected and the other pair of the module-site monitoring terminal 12b and the interposer-site monitoring terminal 11b are also electrically connected. And through monitoring the above-mentioned current condition, it becomes possible to equivalently confirm (monitor) the electric connection between the interposer-site electric joints 3a-3x and the module-site electric joints 5a-5x and to monitor the electric contact condition.

In this manner, in the LSI package according to the first embodiment of the present invention, it is possible to confirm (monitor) the electric contact condition between the interposer-site electric joints 3a-3x and the module-site electric joints 5a-5x.

In the LSI package according to the first embodiment of the present invention, the length of the micro pins which implement the module-site electric joints 5a-5x is 1 mm. Therefore, for instance, in the case where the size of the interposer 2 is 40 mm×40 mm, poor contact (poor connection) is not generated if the angle of the mounting inclination between the I/F module 4 against the interposer 2 is larger than 1 degree. However, the situation where the electrical contact is not well achieved over the whole site may arise, when the inclination between the interposer 2 and the I/F module 4 occurs because of contamination of dirt to the electric joints, etc.

In the above-mentioned case, it is advantageous to establish electric contact monitoring terminals in not only one location but in over two locations. Namely, in the configuration of FIGS. 4A and 4B, by connecting a voltage supply or a current supply, etc. to the monitor wiring 13c on the opposite side (right side) of the interposer-site monitoring terminals 11a and 11b on the left of FIG. 4B and by equivalently confirming the electric contact condition between the interposer 2 and the I/F module 4, the monitoring circuit can be established by a route from the monitor wiring 13c to the ground (GND) wiring 13d through the interposer-site monitoring terminal 11c, the module-site monitoring terminal 12c, the conductive path (short-circuit path) 15b, the module-site monitoring terminal 12d and the interposer-site monitoring terminal lid. Namely, current can be supplied to the monitoring circuit on the right side of FIGS. 4A and 4B in the condition where one pair of the interposer-site monitoring terminal 11c and the module-site monitoring terminal 12c on the right side of FIGS. 4A and 4B are electrically connected and the other pair of the module-site monitoring terminal 12c and the interposer-site monitoring terminal 11d on the right side of FIGS. 4A and 4B are also electrically connected. And through monitoring of the electric contact in the monitoring circuit on the right side, simultaneously along with monitoring of the electric contact in the monitoring circuit on the left side, monitoring of the electrical contact condition between the interposer-site electric joints 3a-3x and the module-site electric joints 5a-5x can be surely realized.

In this manner, if currents can be supplied to the above-mentioned monitoring circuits disposed at both sides of a configuration shown in FIGS. 4A and 4B, poor contact seldom occurs in the electric connecting joints between the monitoring circuits of both side of FIGS. 4A and 4B. If a poor contact occurs in the electric connecting joints disposed between the monitoring circuits at both ends, though current is supplied to the monitoring circuits at both ends, such poor contact is mostly caused by a malfunction of the interposer 2 and/or the I/F module 4 itself (including the electric joints), and the main cause of poor contact is ascribable to a separate problem which is different from functional problems such as the monitoring circuits are not working. In the LSI package according to the first embodiment, though the monitoring circuit on the left side can monitor the electric contact condition independently from the monitoring circuit on the opposite side (right side), it is possible to monitor a whole united circuit at one time by confirming the electric conduction between the monitor wiring 13a on the left side and the monitor wiring 13c on the opposite side (right side), because the ground wirings 13b and 13d are connected mutually by GND. This united electric contact monitoring system can serve to simplify the monitoring mechanism by confirming the whole electric contact condition by a single united monitor circuit. And on the contrary, when poor contact is detected, it is possible to analyze which circuit caused the poor contact by separately examining the monitoring circuits on both sides. These different modes of operation can be selected by choosing two electrode wirings from a combination of three electrode wirings of the monitor wiring 13a on the left side, the monitor wiring 13c on the right side and GND.

In the case of the LSI package according to the first embodiment shown in FIG. 1 to FIG. 4B, each of the monitoring circuits is assigned at two corners of a rectangular arrangement of the electric joints, the assignment of configuration and topology of the monitoring circuits is not limited to those shown in FIG. 1 to FIG. 4B. For instance, the monitoring circuits can be assigned at all four corners of the rectangular arrangement of the electric joints, and poor mounting between the I/F module 4 and the interposer 2 can be prevented through assigning monitoring circuits at four points which are located respectively in the middle of the four sides of the rectangular arrangement of the electric joints.

As in the case of FIGS. 5A and 5B, mounting of the I/F module 4 on the interposer 2 can be done by fixing the I/F module 4 along with the heat sink 21 attached on to the upper part of the I/F module 4 by screw or adhesive. However, poor contact of the electric joints may occur by a change with the passage of time, or aging effects. However, the LSI package according to the first embodiment of the present invention has the advantage that the system maintenance is also simplified since whether poor contact of the electric joints has occurred or not can be confirmed easily.

As mentioned above, the LSI package according to the first embodiment of the present invention, whether poor contact of the electric joints between the I/F module 4 and the interposer 2 has occurred and whether a malfunction of the wiring board is caused by poor contact of the electric joints between the I/F module 4 and the interposer 2 can be easily diagnosed. In other words, according to the LSI package of the first embodiment, it is possible to analyze failure causes including poor mounting of the I/F module 4 on the interposer 2 such as incomplete insertion of the I/F module 4 and contamination of dirt to the electric joints quickly and surely with ease. These failure causes are easily recovered by re-mounting the I/F module 4 and by air gun blowing of the electric joints, which achieves an improvement of product reliability. And from the viewpoint of quality control, poor contact of the electric joints can be detected immediately so as to counter the above-mentioned failure-causes.

According to the LSI package of the first embodiment, it is possible to conduct a reflow-process, after removing the I/F module 4 from the interposer 2, in a usual manufacturing line. In addition, by making electrical connection between the interposer 2 and the I/F module 4 through mechanical contact, position controlling accuracy with extremely high precision is not required, which establishes a comparatively simple holding mechanism.

As mentioned above, since it becomes possible to monitor the electric contact condition between the interposer 2 and the I/F module 4 easily according to the LSI package of the first embodiment, investment in a new manufacturing line in which the reflow-process is designed so that it is only possible under specific condition becomes unnecessary. In addition, because a highly precise position controlling technology, a pressure mechanism and a holding mechanism, etc. are unnecessary for the configuration of electrical connectors, cost reduction can be achieved. And further, because such equipment for monitoring poor assembly in electric joints and alarming the degradation of performances associated with the passage of time can be attached, an LSI package with low-cost and high-reliability can be obtained. Therefore, according to the LSI package of the first embodiment, interconnection between high-speed chips of the signal processing LSI 1 can be realized at a low cost, and it becomes possible to promote the upgrading of information communication equipment, etc.

Second Embodiment

Figure 6:
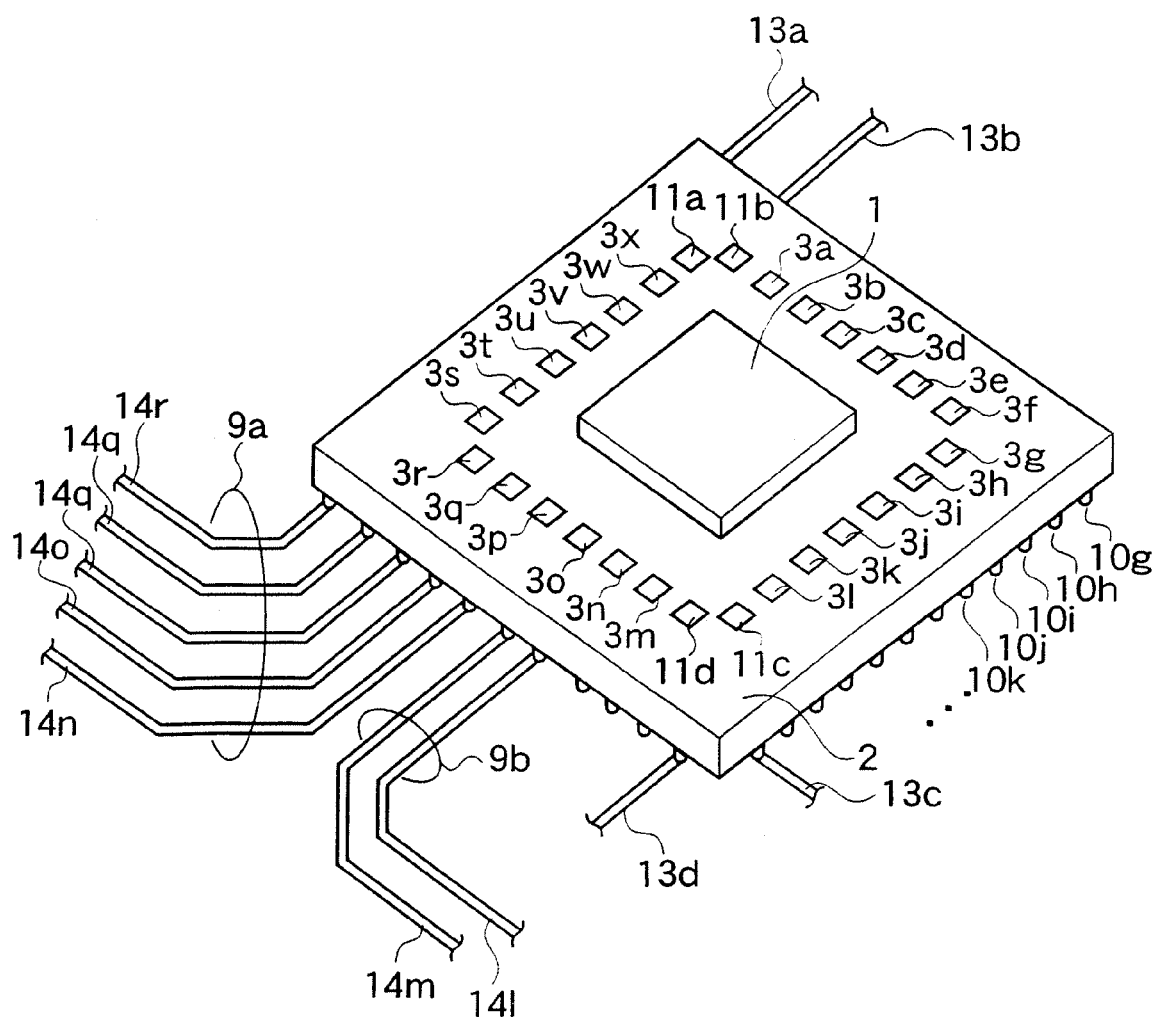
FIG. 6 shows the enlarged bird's-eye view of an interposer and the configuration around the interposer according to a second embodiment of the present invention.
Figure 7:
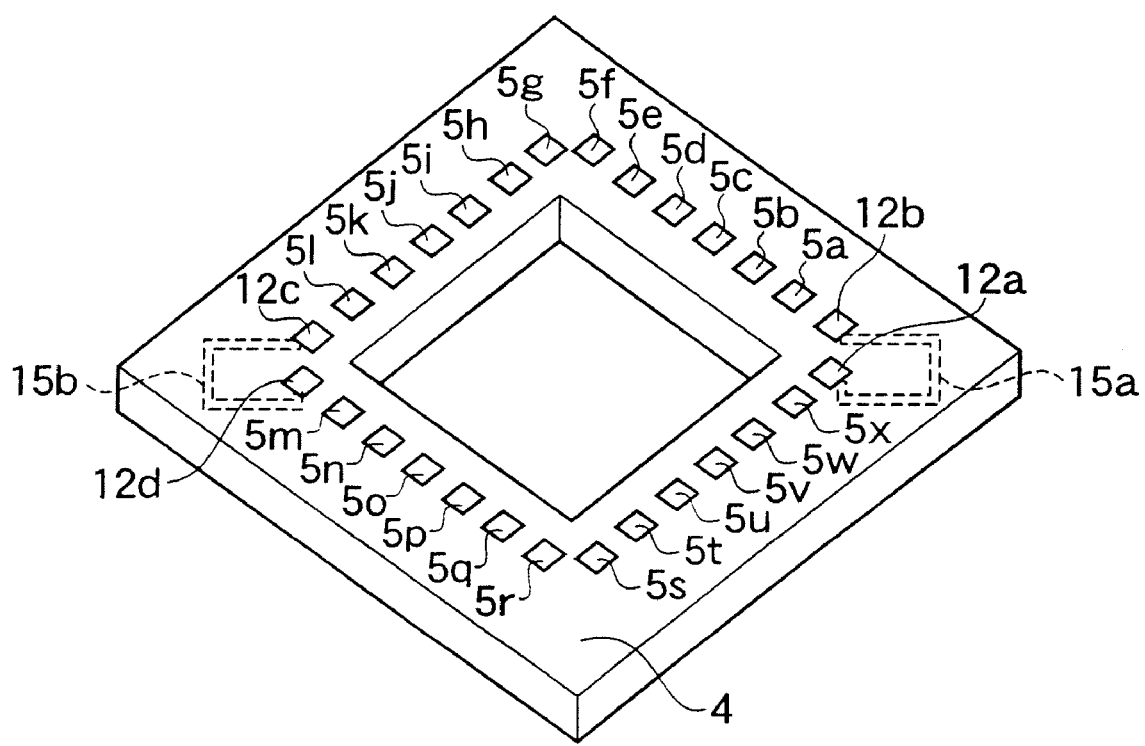
FIG. 7 is an enlarged bird's-eye view showing an I/F module according to the second embodiment of the present invention.

In the LSI package according to the first embodiment of the present invention, the module-site electric joints (second electric joints) 5a-5x and the module-site monitoring terminals (second monitoring terminals) 12a, 12b, 12c and 12d are implemented by micro pins, and the interposer-site electric joints (first electric joints) 3a-3x and the interposer-site monitoring terminals (first monitoring terminals) 11a, 11b, 11c and 11d are implemented by micro sockets, as shown in FIG. 6 and FIG. 7, joints having a more simpler configuration such as where opposing upper and lower metallic film patterns (lands) join with each other may well be adopted as the electric joints and the monitoring terminals of the monitoring circuit in a second embodiment.

FIG. 6 shows the enlarged birds-eye view of an interposer 2 and the configuration around the interposer 2 according to the second embodiment of the present invention. The interposer 2 is connected to board wirings 14l, 14m, 14n, ... 14r on a printed wiring board (the illustration is omitted) by the board-connecting joints (solder balls) 10a, 10b, ... 10r to the interposer 2. In FIG. 6, although the illustration of the printed wiring board is omitted, the board wirings 14n, 14o ... 14r delineated on the printed wiring board, implementing the board wiring group 9a, and the board wirings 14m, 14l delineated on the printed wiring board, implementing the board wiring group 9b, are shown. In addition, the monitor wirings 13a, 13c and the ground wirings 13b, 13d etc. disposed on the printed wiring board are also shown.

On the interposer 2 according to the second embodiment, the module-connecting terminals (3a-3x; 11a-11d) are implemented by simple rectangular patterns of metallic films (lands). And corresponding to the module-connecting terminals (3a-3x; 11a-11d), the interposer-connecting terminals (5a-5x; 12a-12d) are also implemented by simple rectangular patterns of metallic films (lands). In the LSI package according to the second embodiment of the present invention, part of the module-connecting terminals (3a-3x; 11a-11d) and the interposer-connecting terminals (5a-5x; 12a-12d), which are implemented by simple metallic film patterns (lands), are used as monitoring circuits configured to equivalently confirm the electric contact condition between the signal processing LSI 1 and the I/F module. That is to say, an array of the module-connecting terminals 3a-3x and 11a-11d, which are disposed on the interposer 2, are classified into two parts including the interposer-site electric joints 3a-3x and the interposer-site monitoring terminals 11a, 11b, 11c, and 11d, while an array of the interposer-connecting terminals 5a-5x and 12a-12d, which are disposed on the I/F module 4, are classified into two parts including the module-site electric joints 5a-5x and the module-site monitoring terminals 12a, 12b, 12c and 12d.

In defining and classifying the metallic film patterns (lands) as mentioned above, FIG. 6 shows a perspective configuration in which the interposer-site electric joints (lands) 3a-3x of around 100 μm□-0.8 mm□ are arranged so that the array of interposer-site electric joints 3a-3x surround the signal processing LSI 1 around the peripheral region of the interposer 2, on which the signal processing LSI 1 is mounted. FIG. 6 also shows a configuration in which four interposer-site monitoring terminals (lands) 11a, 11b, 11c and 11d are assigned at two corners of a rectangular arrangement of the interposer-site electric joints 3a-3x. In addition to the rectangular pattern around 100 μm□-0.8 mm□, a metallic film electrode of a circular geometry around 8 mm$^\Phi$ may be used for the connecting terminals. The interposer-site electric joints 3a-3x and the interposer-site monitoring terminals 11a, 11b, 11c and 11d may be formed simultaneously as surface electrodes when interposer-site surface wirings are delineated on the interposer 2.

FIG. 7 is an enlarged bird's-eye view showing the I/F module 4 according to the second embodiment of the present invention. At the center of the I/F module 4, a rectangular window is formed. The rectangular window has a size in which the rectangular signal processing LSI 1 can be accommodated, when the I/F module 4 is mounted on the interposer 2. In the I/F module 4 shown in FIG. 7, an array of the module-site electric joints (lands) 5a-5x around 100 μm□-0.8 mm□, corresponding to the array of interposer-site electric joints (lands) 3a-3x around 100 μm□-0.8 mm□, are arranged as a rectangular geometry around the rectangular window. Further, the module-site monitoring terminals (lands) 12a, 12b, 12c and 12d which are implemented by rectangular patterns around 100 μm□-0.8 mm□ are disposed at the corners of the rectangular arrangement of the module-site electric joints (lands) 5a-5x, corresponding to the interposer-site monitoring terminals (lands) 11a, 11b, 11c and 11d shown in FIG. 6. At the right side corner of the I/F module 4 shown in FIG. 7, a conductive path (short-circuit path) 15a, which electrically connects between the first module-site monitoring terminal 12a and the second module-site monitoring terminal 12b at low impedance, is shown. And a conductive path (short-circuit path) 15b which electrically connects between the third module-site monitoring terminal 12c and the fourth module-site monitoring terminal 12d is shown at the left side corner of the I/F module 4 shown in FIG. 7. In addition to the rectangular patterns around 100 μm□-0.8 mm□ in FIG. 7, circular electrodes around 8 mm$^\Phi$ may be used for the monitoring terminals. The module-site electric joints 5a-5x and the module-site monitoring terminals 12a, 12b, 12c and 11d may be delineated as surface electrodes when the surface wirings are delineated on the I/F module 4. Generally, in the interconnection of the interposer 2 and the I/F module 4, a portion of the metallic pattern not required to come to the surface for electrical connection is covered with a solder resist film, etc. And because of this, the interposer-site electric joints 3a-3x, the interposer-site monitoring terminals 11a, 11b, 11c, 11d, the module-site electric joints 5a-5x and the module-site monitoring terminals 12a, 12b, 12c, 12d are often recessed from the surface level of the solder resist film around 20-50 μm. Then, gaps are established between the interposer-site electric joints 3a-3x and the module-site electric joints 5a-5x, or between the interposer-site monitoring terminals 11a, 11b, 11c, 11d, and the module-site monitoring terminals 12a, 12b, 12c, 12d, when the joints and terminals are joined as they are. Therefore, it is desirable that metallic films are plated or bumps are formed in the recessed electrode (lands) portion so as to bury the gaps. Or it is desirable that patterns of anisotropic conductive paste or anisotropic conductive sheets are formed in the recessed electrode (lands) portion so as to bury the gaps. Solder balls, gold (Au) bumps, silver (Ag) bumps, cupper (Cu) bumps, nickel-gold (Ni—Au) alloy bumps or nickel-gold-indium (Ni—Au—In) alloy bumps, etc. are acceptable for bumps or connection members. An eutectic solder having a composition ratio such as tin (Sn):lead (Pb) =6:4 with a diameter of 100 μm to 250 μm, height of 50 μm to 100 μm, can be used for the solder ball. Or, an eutectic solder having a composition ratio of Sn:Pb=5:95 may be used for the solder ball.

The interposer-site electric joints (lands) 3a-3x, the module-site electric joints 5a-5x (lands), the interposer-site monitoring terminals (lands) 11a, 11b, 11c, 11d and the module-site monitoring terminals (lands) 12a, 12b, 12c, 12d can be made of metallic films, or metallic thin plates including aluminum (Al), copper (Cu), copper alloys such as Cu—Fe, Cu—Cr, Cu—Ni—Si, Cu—Sn, etc., ferronickel-alloys such as Ni—Fe, Fe—Ni—Co, etc. and composite material of copper and stainless steel, etc. In addition, the electric joints and monitoring terminals may be covered by nickel (Ni) plating film and/or gold (Au) plating film, etc. on the surface of the metallic materials.

Then, each of the interposer-site electric joints (lands) 3a-3x is mutually and electrically connected to the corresponding module-site electric joints 5a-5x (lands) by connection members such as bumps. Similarly, each of the interposer-site monitoring terminals (lands) 11a, 11b, 11c and 11d shown in FIG. 6 is mutually and electrically connected to the corresponding module-site monitoring terminals (lands) 12a, 12b, 12c and 12d shown in FIG. 7 by connection members.

Each of the interposer-site monitoring terminals (lands) 11a, 11b, 11c and 11d shown in FIG. 6 and the corresponding module-site monitoring terminals (lands) 12a, 12b, 12c and 12d shown in FIG. 7 serve as contact monitors for equivalently confirming the electrical connection by mechanical contact of each of the interposer-site electric joints (lands) 3a-3x with the corresponding module-site electric joints (lands) 5a-5x.

FIGS. 8A and 8B are cross-sectional views showing the connecting terminals of the LSI package according to the second embodiment of the present invention. FIG. 8A is a schematic cross-sectional view of the I/F module 4, taken on a plane perpendicular to the surface of the I/F module 4, the ringed plane running along the ringed array of the module-site electric joints 5a-5x, which are arranged in rectangular topology around the rectangular window of FIG. 7, and the module-site monitoring terminals 12a, 12b, 12c, 12d which are assigned at two corners of the rectangular arrangement of the electric joints 5a-5x. Similarly, FIG. 8B is a schematic cross-sectional view of the interposer 2, cutting off with a ringed plane along the array of interposer-site electric joints 3a-3x which are arranged in a rectangular topology around the signal processing LSI 1 of FIG. 6, and the interposer-site monitoring terminals 11a, 11b, 11c, 11d which are assigned at two corners of the rectangular arrangement of the electric joints 3a-3x. Here, the same or similar reference numerals of FIG. 4 in the LSI package according to the first embodiment are applied to the same or similar functions. In the configuration of FIGS. 8A and 8B, by connecting a voltage supply or a current supply to the monitor wiring 13a on the left side of FIG. 8B and by equivalently confirming the electric contact condition (electrical connection condition) between the signal processing LSI 1 and the I/F module 4, the monitoring circuit can be established by a route from the monitor wiring 13a to the ground (GND) wiring 13b through the interposer-site monitoring terminal 11a, the module-site monitoring terminal 12a, the conductive path (short-circuit path) 15a, the module-site monitoring terminal 12b and the interposer-site monitoring terminal 11b. Namely, current can be supplied to the monitoring circuit in the above-mentioned configuration where one pair of the interposer-site monitoring terminal 11a and the module-site monitoring terminal 12a are electrically connected and the other pair of the module-site monitoring terminal 12b and the interposer-site monitoring terminal 11b are also electrically connected. And through monitoring the above-mentioned current condition, it becomes possible to equivalently confirm (monitor) the electric connection between the interposer-site electric joints 3a-3x and the module-site electric joints 5a-5x and to monitor the electric contact condition.

And by connecting a voltage supply or a current supply, etc. to the monitor wiring 13c on the opposite side (right side) of the interposer-site monitoring terminals 11a and 11b and by equivalently confirming the electric contact condition between the interposer 2 and the I/F module 4, the monitoring circuit can be established by a route from the monitor wiring 13c to the ground (GND) wiring 13d through the interposer-site monitoring terminal 11c, the module-site monitoring terminal 12c, the conductive path (short-circuit path) 15b, the module-site monitoring terminal 12d and the interposer-site monitoring terminal 11d. Namely, current can be supplied to the monitoring circuit on the right side of FIGS. 8A and 8B in the configuration where one pair of the interposer-site monitoring terminal 11c and the module-site monitoring terminal 12c on the right side of FIGS. 8A and 8B are electrically connected and the other pair of the module-site monitoring terminal 12d and the interposer-site monitoring terminal 11d on the right side of FIGS. 8A and 8b are also electrically connected. And as well as the LSI package according to the first embodiment, through monitoring of the electric contact in the monitoring circuit on the right side, simultaneously along with monitoring of the electric contact in the monitoring circuit on the left side, monitoring of the electric contact condition between the interposer-site electric joints $3a$-$3x$ and the module-site electric joints $5a$-$5x$ can be surely realized.

Namely, in the LSI package according to the second embodiment of the present invention, for performing operation of the monitoring circuit, it is enough for the LSI package to encompass at least one pair of the module-connecting terminals (lands) mutually and electrically short-circuited among the module-connecting terminals (lands) $3a$-$3x$; $11a$-$11d$ on the interposer 2, or at least one pair of the interposer-connecting terminals (lands) mutually and electrically short-circuited among the interposer-connecting terminals (lands) $5a$-$5x$; $12a$-$12d$ on the I/F module 4. The pair of monitoring terminals is electrically connected as part of the monitoring circuit for equivalently confirming the electric contact condition between the signal processing LSI 1 and the I/F module 4. Therefore, FIG. 7 shows that a port between the first module-site monitoring terminal 12a and the second module-site monitoring terminal 12b established by simple metallic film patterns (lands) on the I/F module 4 are electrically short-circuited by the conductive path (short-circuit path) 15a, and a port between the third module-site monitoring terminal 12c and the fourth module-site monitoring terminal 12d established by simple metallic film patterns (lands) of the I/F module 4 are electrically short-circuited by the conductive path (short-circuit path) 15b.

As mentioned above, the configuration of the LSI package according to the second embodiment is similar to the first embodiment, except for the feature that the geometry (configuration) of connecting terminals is different; an explanation of other parts which overlap will be omitted.

The feature of the LSI package according to the second embodiment is that the cost of component materials can be kept to a minimum since micro pins and micro sockets are not required and the manufacturing yield is high since there is no destruction of micro pins which is caused by incomplete insertion of the micro pins.

On the contrary, poor contact (poor connection) because of contamination of dirt, etc. between the connecting terminals can occur easily, due to the geometrical feature of the plane electrodes.

In any case, if the failure-causes happen, the LSI package according to the second embodiment can be immediately repaired when the I/F module is mounted on the interposer 2, because the failures of the electrical connection can be confirmed in real time.

According to the LSI package of the second embodiment, similar to the first embodiment, it is possible to conduct a reflow-process, after removing the I/F module 4 from the interposer 2 in a usual manufacturing line. In addition, by making electrical connection between the interposer 2 and the I/F module 4 through the joining of simple metallic film patterns (lands), position controlling accuracy with extremely high-precision is not required, which establishes a compara-tively simple holding mechanism. Since it becomes possible to monitor the electric contact condition between the interposer 2 and the I/F module 4 by a simple configuration of metallic film patterns, investment in a new manufacturing line in which the reflow-process is designed so that it is only possible under specific condition becomes unnecessary. In addition, because a highly precise position controlling technology, a pressure mechanism and a holding mechanism, etc. are unnecessary for the configuration of electrical connectors, a significant cost reduction can be achieved. And further, because such equipment for monitoring poor assembly in electric joints and alarming the degradation of performances associated with the passage of time can be attached, an LSI package with low-cost and high-reliability can be obtained. Therefore, according to the LSI package of the second embodiment, interconnection between high-speed chips of the signal processing LSI 1 can be realized at a low cost, and it becomes possible to promote the upgrading of information communication equipments, etc.

Third Embodiment

Figure 9A:
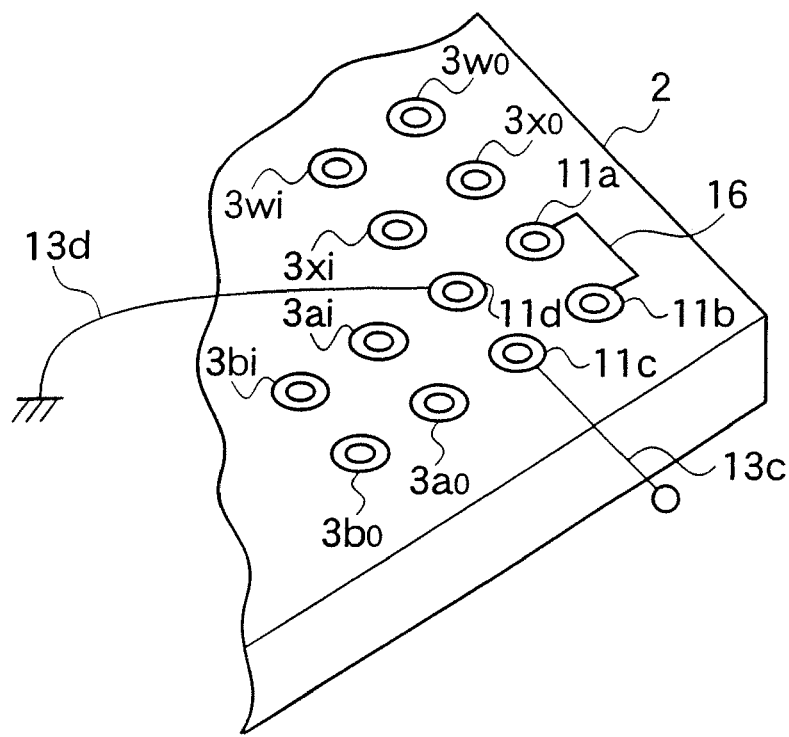
FIG. 9A shows part of an enlarged bird's-eye view of an interposer of an LSI package provided with an I/F module of a third embodiment of the present invention.
Figure 9B:
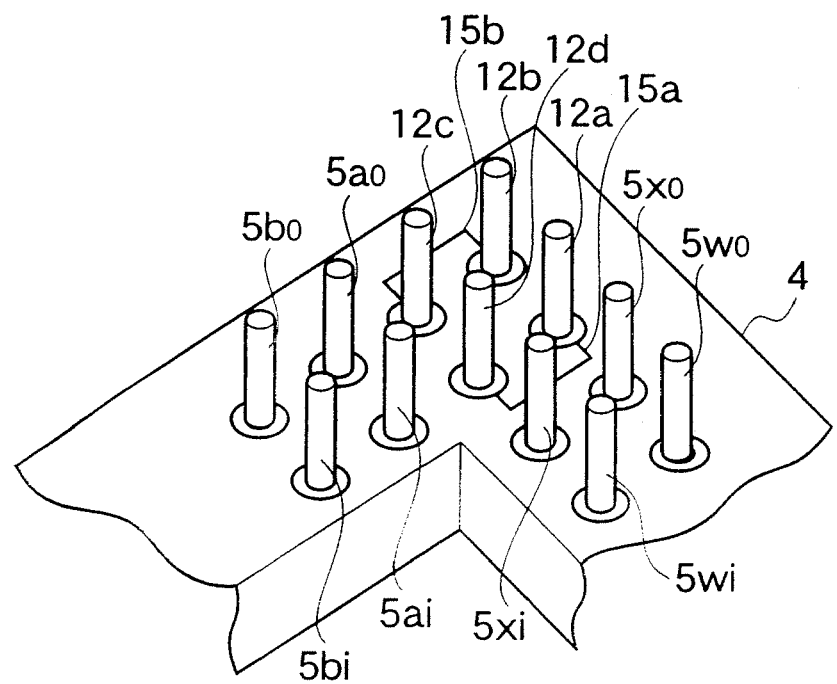
FIG. 9B shows part of an enlarged bird's-eye view of an I/F module of the LSI package of the third embodiment of the present invention.

As shown in FIGS. 9A and 9B, an LSI package of a third embodiment has such a configuration where interposer-site electric joints (first electric joints or micro sockets) $3ao$, $3bo$, ... $3wo$, $3xo$; $3ai$, $3bi$, ... $3wi$, $3xi$ are arranged in two arrays at the top surface of and in an interposer 2, and module-site electric joints (second electric joints or micro pins) $5ao$, $5bo$, ... $5wo$, $5xo$; $5ai$, $5bi$, ... $5wi$, $5xi$ are arranged in two arrays on an I/F module 4.

FIG. 9A shows part of the enlarged bird's-eye view of the interposer 2 in the LSI package of the third embodiment. Though illustration is omitted, similar to FIGS. 1 and 2, a signal processing LSI 1 is mounted on the interposer 2 of FIG. 9A. Then, the interposer-site electric joints (micro sockets) $3ao$, $3bo$, ... $3wo$, $3xo$; $3ai$, $3bi$, ... $3wi$, $3xi$ are arranged in a double concentric rectangular ring so that dual arrays of the interposer-site electric joints (micro sockets) surround the signal processing LSI 1 around the peripheral region of the interposer 2, on which the signal processing LSI 1 is mounted. FIG. 9A also shows a configuration in which four interposer-site monitoring terminals (first monitoring terminals or micro sockets) 11a, 11b, 11c and 11d are assigned in a matrix configuration of 2×2 (two rows by two columns) at a corner of the double concentric rectangular ring which are implemented by the dual arrays of the interposer-site electric joints (micro sockets) $3ao$, $3bo$, ... $3wo$, $3xo$; $3ai$, $3bi$, ... $3wi$, $3xi$.

FIG. 9B shows part of an enlarged bird's-eye view of the I/F module 4 of the LSI package of the third embodiment. Similar to the configuration of FIG. 3, at the center of the I/F module 4, a rectangular window having the size in which the rectangular signal processing LSI 1 can be accommodated, when the I/F module 4 is mounted on the interposer 2, has been established. In the I/F module 4 shown in FIG. 9B, dual arrays of the module-site electric joints $5ao$, $5bo$, ... $5wo$, $5xo$; $5ai$, $5bi$, ... $5wi$, $5xi$ (micro pins), corresponding to the dual arrays of the interposer-site electric joints $3ao$, $3bo$, ... $3wo$, $3xo$; $3ai$, $3bi$, ... $3wi$, $3xi$ have been arranged as a double concentric rectangular ring around the rectangular window. By mechanical contact of each of the dual arrays of the interposer-site electric joints $3ao$, $3bo$, ... $3wo$, $3xo$; $3ai$, $3bi$, ... $3wi$, $3xi$ and the corresponding dual arrays of the module-site electric joints $5ao$, $5bo$, ... $5wo$, $5xo$; $5ai$, $5bi$, ... $5wi$, $5xi$, the interposer 2 and the I/F module 4 are mutually and electrically connected. FIG. 9B also shows a configuration in which four module-site monitoring terminals (second monitoring terminals or micro pins) 12a, 12b, 12c and 12d, which correspond to the interposer-site monitoring terminals 11a, 11b, 11c and 11d of FIG. 9A, are assigned in a matrix configuration of 2×2 at a corner of the double concentric rectangular ring which are implemented by the dual arrays of the module-site electric joints (micro pins) 5ao, 5bo, . . . 5wo, 5xo; 5ai, 5bi, . . . 5wi, 5xi.

At the corner of the I/F module 4 shown in FIG. 9B, a first conductive path (short-circuit path) 15a, which electrically connects between the module-site monitoring terminals 12a and 12d at low impedance, is shown. And a second conductive path (short-circuit path) 15b, which electrically connects between the interposer-site monitoring terminals 12b and 12c, are also shown in FIG. 9B. On the while, at the corner of the interposer 2 shown in FIG. 9A, a third short circuit path 16, which electrically connects between the interposer-site monitoring terminals (micro sockets) 11a and 11b is shown. In this manner, the LSI package according to the third embodiment of the present invention, for performing operation of the monitoring circuit, employs such a topology that at least one pair of the interposer-site monitoring terminals (micro sockets) is mutually and electrically short-circuited among four interposer-site monitoring terminals 11a, 11b, 11c and 11d on the interposer 2 and that at least one pair of the module-site monitoring terminals (micro pins) is mutually and electrically short-circuited among four module-site monitoring terminals 12a, 12b, 12c and 12d on the I/F module 4. FIG. 9B shows a topology where two pairs of monitoring terminals 12b and 12c at a first column and 12a and 12d at a second column are electrically short-circuited among four module-site monitoring terminals 12a to 12d, implementing a matrix of 2×2 (two rows by two columns). As mentioned above, it is enough for the LSI package to make at least one pair of the module-connecting terminals (micro sockets) is mutually and electrically short-circuited among the module-connecting terminals (micro sockets) 3a-3x; 11a-11d on the interposer 2, or at least one pair of the interposer-connecting terminals (micro sockets) is mutually and electrically short-circuited among the interposer-connecting terminals (micro sockets) 5a-5x; 12a-12d on the I/F module 4 so as to achieve operation of the monitoring circuit, and the pair of monitoring terminals is electrically connected as part of the monitoring circuit for equivalently confirming the electric contact condition (electrical connection condition) between the signal processing LSI 1 and the I/F module 4.

Each of the interposer-site monitoring terminals 11a, 11b, 11c and 11d of FIG. 9A, which are arranged in a matrix configuration of 2×2 on the interposer 2, and each of the corresponding module-site monitoring terminals (micro pins) 12a, 12b, 12c and 12d of FIG. 9B, which are arranged in a matrix configuration of 2×2 on the I/F module 4, are the monitoring terminals for equivalently confirming the electric contact condition by mechanical contact between each of the dual arrays of the interposer-site electric joints 3ao, 3bo, . . . 3wo, 3xo; 3ai, 3bi, . . . 3wi, 3xi and the corresponding dual arrays of the module-site electric joints 5ao, 5bo, . . . 5wo, 5xo; 5ai, 5bi, . . . 5wi, 5xi.

As shown in FIGS. 9A and 9B, since there are dual arrays of the interposer-site electric joints 3ao, 3bo, . . . 3wo, 3xo; 3ai, 3bi, . . . 3wi, 3xi and the corresponding dual arrays of the module-site electric joints 5ao, 5bo, . . . 5wo, 5xo; 5ai, 5bi, . . . 5wi, 5xi, according to a methodology employing the configuration shown in FIGS. 1 to 4, whether the dual arrays have been joined properly or not occurs sometimes and is caused by the relative shift of the opposing terminals. Namely, when an equivalent short conductive path is formed in an adjacent column by the relative shift of the opposing terminals, it cannot be distinguished whether the current is supplied by the monitoring circuit or an unintentional short-circuit failure of the conductive path due to the adjacent column.

Therefore, for preventing an erroneous judgment due to the relative shift of the opposing terminals in the dual array, as shown in FIG. 9B, the first conductive path (short-circuit path) 15a and the second conductive path (short-circuit path) 15b are assigned at the corner of the I/F module 4, spanning to cover two columns in the double concentric rectangular ring arrangement of the module-site electric joints 5ao, 5bo, . . . 5wo, 5xo; 5ai, 5bi, . . . 5wi, 5xi. And at the same time, for preventing the erroneous judgment, as shown in FIG. 9A, the third conductive path (short-circuit path) 16 is assigned at the corner of the interposer 2, spanning two columns of the double concentric rectangular ring arrangement of the interposer-site electric joints 3ao, 3bo, . . . 3wo, 3xo; 3ai, 3bi, . . . 3wi, 3xi.

In FIGS. 9A and 9B, a monitoring circuit is formed by a route from the monitor wiring 13c to the ground (GND) wiring 13d through the interposer-site monitoring terminal 11c, the module-site monitoring terminal 12c, the second conductive path (short-circuit path) 15b, the module-site monitoring terminal 12b and the interposer-site monitoring terminal 11b, the third conductive path (short-circuit path) 16, the interposer-site monitoring terminal 11a, the module-site monitoring terminal 12a, the first conductive path (short-circuit path) 15a, the module-site monitoring terminal 12d and the interposer-site monitoring terminal 11d. According to the circuit route mentioned above, it becomes possible to detect an abnormality due to the situation by which the opposing arrays are relatively shifted, since the monitoring circuit becomes an open-circuit by the relative shift of the opposing arrays.

Modification of Third Embodiment

Figure 10A:
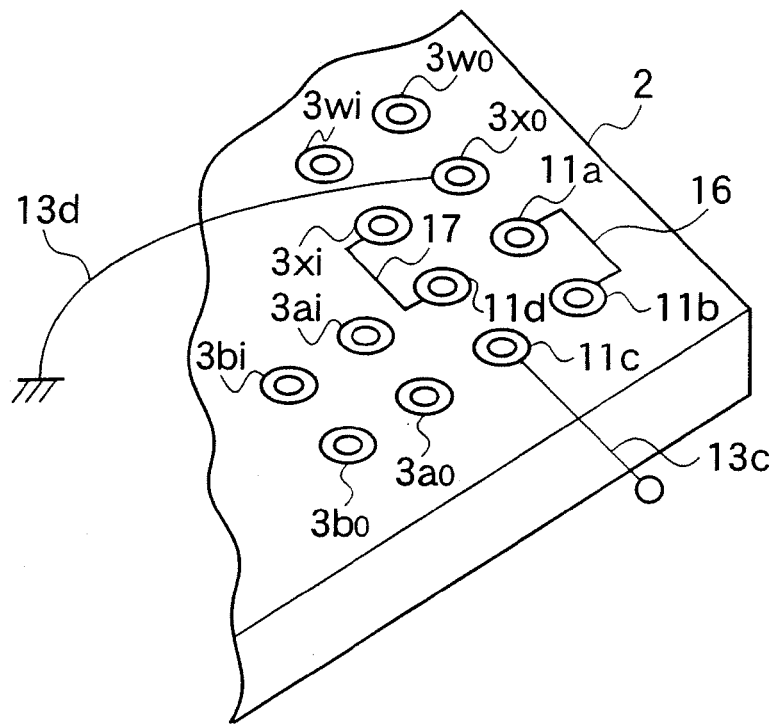
FIG. 10A shows part of an enlarged bird's-eye view of an interposer of an LSI package provided with an I/F module according to a modification of the third embodiment of the present invention.
Figure 10B:
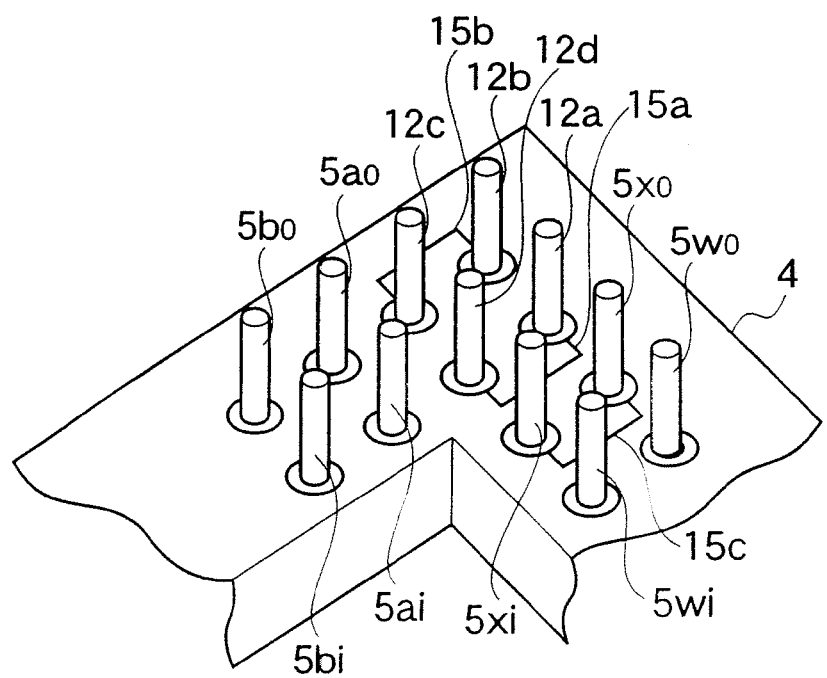
FIG. 10B shows part of an enlarged bird's-eye view of an I/F module of the LSI package according to the modification of the third embodiment of the present invention.

A similar monitoring circuit can be established by a configuration spanning three columns of the electric joints in the double concentric rectangular ring as shown in FIGS. 10A and 10B. In FIG. 10A, the interposer-site electric joints (first electric joints) 3xo and 3xi at the third column are used for the additional monitoring terminals. An additional conductive path (short-circuit path) 17 is formed between the interposer-site electric joint 3xi at the third column and the interposer-site monitoring terminal (first monitoring terminal) 11d at the second column. The additional conductive path (short-circuit path) 17 faces a row in which the third conductive path (short-circuit path) 16 between the first and second columns is formed so as to implement a zigzag configuration with the conductive path (short-circuit path) 16. Although the feature that a monitor wiring 13a is connected to an interposer-site electric joint 11c of the first column is similar to the configuration shown in FIG. 9A, a ground wiring 13d is connected between the interposer-site electric joint 3xo and GND in a modification of the third embodiment shown in FIG. 10A.

In FIG. 10B, the module-site electric joints (second electric joints) 5xo and 5xi at the third column are used for the monitoring terminals and an additional conductive path (short-circuit path) 15c is assigned between the module-site electric joint 5xo and 5xi so that the monitoring circuit can extend one column ahead of the conductive path (short-circuit path) 15a, so as to establish a zigzag route with the conductive path (short-circuit path) 15a.

According to the modification of the third embodiment shown in FIGS. 10A and 10B, a monitoring circuit is formed by a route from the monitor wiring 13c to the ground (GND) wiring 13d through the interposer-site monitoring terminal (first monitoring terminal) 11c, the module-site monitoring terminal (second monitoring terminal) 12c, the second conductive path (short-circuit path) 15b, the module-site monitoring terminal (second monitoring terminal) 12b and the interposer-site monitoring terminal (first monitoring terminal) 11b, the third conductive path (short-circuit path) 16, the interposer-site monitoring terminal (first monitoring terminal) 11a, the module-site monitoring terminal (second monitoring terminal) 12a, the first conductive path (short-circuit path) 15a, the module-site monitoring terminal (second monitoring terminal) 12d, the interposer-site monitoring terminal (first monitoring terminal) 11d, the additional conductive path (short-circuit path) 17, the interposer-site monitoring terminal (first monitoring terminal) 3xi, the module-site monitoring terminal (second monitoring terminal) 5xi, the additional conductive path (short-circuit path) 15c, the module-site monitoring terminal (second monitoring terminal) 5xo and the interposer-site monitoring terminal (first monitoring terminal) 3xo. By the three columns configuration shown in FIGS. 10A and 10B, a monitoring circuit, which can achieve effectiveness similar to the circuit implemented by two columns shown in FIGS. 9A and 9B, can be established.

Developing the configuration shown in FIGS. 10A and 10B, the interposer-site electric joints and the module-site electric joints can be arranged in three arrays so as to implement a triple concentric rectangular ring surrounding the signal processing LSI 1. In the triple concentric rectangular ring configuration, the rows and columns can be orthogonally exchanged from the topology shown in FIGS. 10A and 10B.

Further, by employing in the same manner, a configuration spanning over four columns as well as the configuration spanning three columns, a monitoring circuit can be accomplished.

According to the LSI packages of the third embodiment and the modification of the third embodiment, similar to the first and the second embodiments, it is possible to conduct a reflow-process, after removing the I/F module 4 from the interposer 2 in a usual manufacturing line. In addition, by making electrical connection between the interposer 2 and the I/F module 4 through mechanical contact using a configuration having a plurality of arrays of the electric joints so as to form a multi-concentric rectangular ring topology over the double concentric rectangular ring, because position controlling accuracy with extremely high-precision is not required, the multi-concentric rectangular ring topology can facilitate a comparatively simple holding mechanism. Since it becomes possible to monitor the electric contact condition between the interposer 2 and the I/F module 4 with a simple matrix configuration of over two columns of the electric joints in the multi-concentric rectangular ring, investment in a new manufacturing line in which the reflow-process is designed so that it is only possible under specific condition becomes unnecessary. In addition, because mechanical mechanisms such as a high-precision inserting mechanism, a pressure mechanism and a holding mechanism are unnecessary for the multi-concentric rectangular ring configuration of electrical connectors, a significant reduction in the cost can be achieved. And further, because various units such as a monitoring unit configured to monitor poor assembly in electric joints and an alarming unit configured to alarm the degradation of performance associated with the passage of time can be attached, an LSI package with low-cost and high-reliability can be obtained.

Therefore, according to the LSI packages of the third embodiment and the modification of the third embodiment, interconnection between high-speed chips of the signal processing LSI 1 can be realized at a low cost, and it becomes possible to promote the upgrading of information communication equipment, etc.

Fourth Embodiment

In the LSI packages according to the first to third embodiments, the power supplying circuit and the detection circuit for the monitoring circuits are not specified. The detection circuit can be facilitated, for instance, by surface interconnections delineated on the printed wiring board 8, which may be connected to the monitor wirings 13a and 13c through through-holes formed in the interposer 2, and connected to detection terminals, which are configured to connect an external detection circuit, arranged on the printed wiring board 8. Alternatively, the power supplying circuit and the detection circuit can be established on the printed wiring board 8, which are connected to the monitor wirings 13a and 13c through through-holes formed in the interposer 2 and surface interconnections delineated on the printed wiring board 8.

Figure 11:
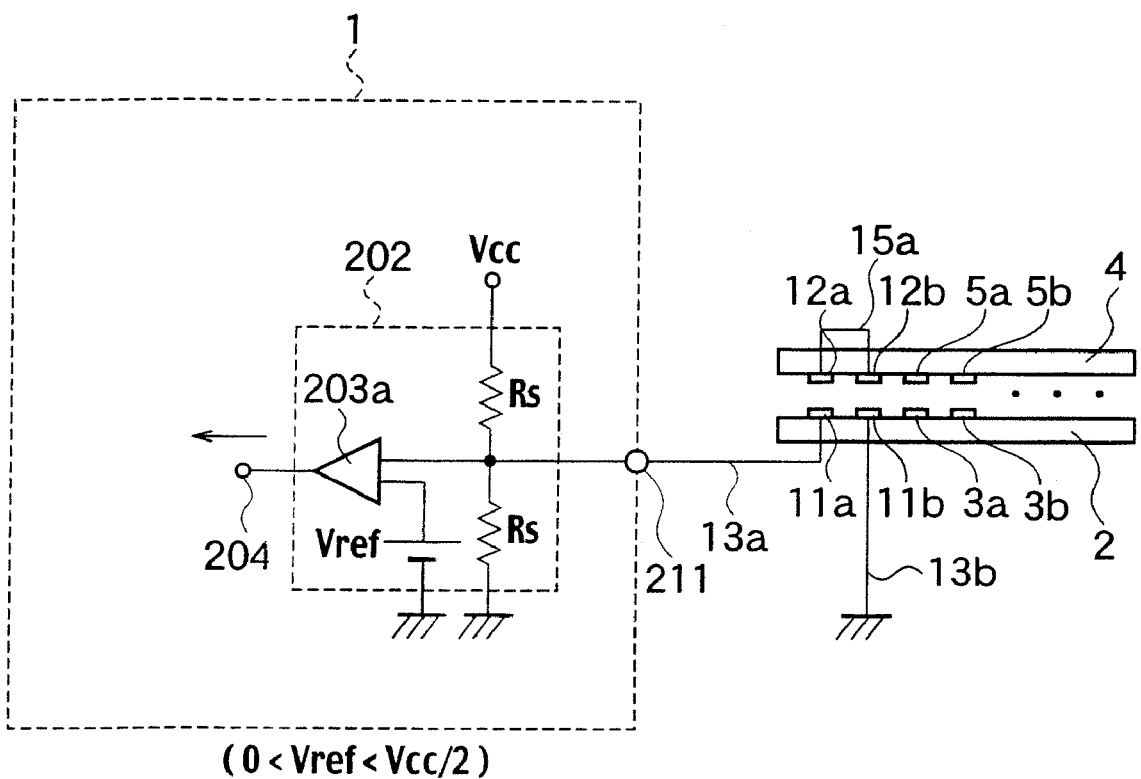
FIG. 11 is a circuit diagram explaining a first conduction confirmation circuit integrated in a signal processing LSI of an LSI package provided with an I/F module of a fourth embodiment of the present invention.

As shown in FIG. 11, in the LSI package according to a fourth embodiment, a conduction confirmation circuit 202 having a function of confirming electrical conduction, is integrated in a signal processing LSI 1. The conduction confirmation circuit 202 of DC conduction type, shown in FIG. 11 includes a status signal generator 203 implemented by a comparator configured to receive a divided voltage (=Vcc/2) of a supply voltage Vcc, which is divided by a voltage divider consisting of two resistors Rs connected in series, at one input terminal and to receive a reference voltage Vref at the other input terminal.

In FIG. 11, current can flow through an I/O terminal 211 of the conduction confirmation circuit 202, under a condition where gaps between an interposer-site monitoring terminal (a first interposer-site monitoring terminal) 11a and a module-site monitoring terminal (a first module-site monitoring terminal) 12a, and between a module-site monitoring terminal (a second module-site monitoring terminal) 12b and an interposer-site monitoring terminal (a second interposer-site monitoring terminal) 11b and are electrically connected simultaneously. As shown in FIG. 11, as the second module-site monitoring terminal 11b is connected to a ground wiring, the potential of the I/O terminal 211 becomes "L" level by the conduction of current. Comparing "L" level with the reference voltage Vref, the status signal generator (comparator) 203 delivers a first status signal "L" (alternatively "H") when the current is normal from a status signal output terminal 204.

On the contrary, in FIG. 11, because current does not flow through the I/O terminal 211 of the conduction confirmation circuit 202, if the electrical connections between the first interposer-site monitoring terminal 11a and/or the first module-site monitoring terminal 12a, and between the second module-site monitoring terminal 12b and the second interposer-site monitoring terminal 11b are poor, the potential of the I/O terminal 211 does not become "L" level, keeping approximately a value of Vcc/2, which is obtained across the lower resistor Rs in a network of the voltage divider consisting of the upper and lower resistors Rs connected in series so as to divide the supply value Vcc by two. Comparing the level of a value approximately the same as Vcc/2 with the reference voltage Vref, the status signal generator (comparator) 203 delivers a second status signal "H" (alternatively "L"), when the electrical connection is abnormal, from the status signal output terminal 204.

With "a monitoring path resistance Rc", which is a total resistance of a conductive route, or a current path from the monitor wiring 13a to the ground (GND) wiring 13b, through the first interposer-site monitoring terminal 11a, the first module-site monitoring terminal 12a, the conductive path (short-circuit path) 15a, the second module-site monitoring terminal 12b and the second interposer-site monitoring terminal 11b, voltage Vc, which is fed to one of the input terminals of the status signal generator (comparator) 203a, is given by:

$$Vc=Vcc/(2+Rs/Rc) \quad (1)$$

Detection of the relationship Vc<Vref, Vc>Vref is equivalent to a monitoring of the variation of the monitoring path resistance Rc of Eq. (1). In case of Rc=∞ (non-conduction), it becomes Vc=Vcc/2 (Vc>Vref), and in case of Rc=0.01Ω (conduction), it becomes Vc~Vcc/100000 (Vc<Vre), assuming the value of Rs=1 kΩ.

In this manner, the conduction confirmation circuit 202 can equivalently confirm (monitor) whether the electric contact (electrical connection) between interposer-site electric joints 3a-3x and module-site electric joints 5a-5x is good or not, by observing the potential at the I/O terminal 211 so as to provide a first status signal "L" (alternatively "H") for a normal condition of the electric contact from the status signal output terminal 204 and a second status signal "H" (alternatively "L") for a poor condition of the electric contact.

As shown in FIG. 11, by integrating the conduction confirmation circuit 202 having a function of electrical connection monitoring in the signal processing LSI 1, an increase in the number of circuit components $X_{ij}$ can be suppressed in the LSI package of the fourth embodiment. In other words, according to the LSI package of the fourth embodiment, while managing not to increase the manufacturing cost of the printed wiring board 8, it is possible to alarm the system of the LSI package, after detecting poor contact (poor connection) within the signal processing LSI 1.

Additional circuits to be integrated in the signal processing LSI 1 can be implemented by circuits of a very small scale, and generally the addition of such small-scale circuits to the signal processing LSI 1 does not serve as a cost-increasing factor to the signal processing LSI 1.

Although the DC conductive type circuit such as the circuit shown in FIG. 11 can be acceptable for the monitoring circuit of the signal processing LSI 1, the DC conductive type circuit has problems of malfunction by noise superposition and an increase in the standby power.

Figure 12:
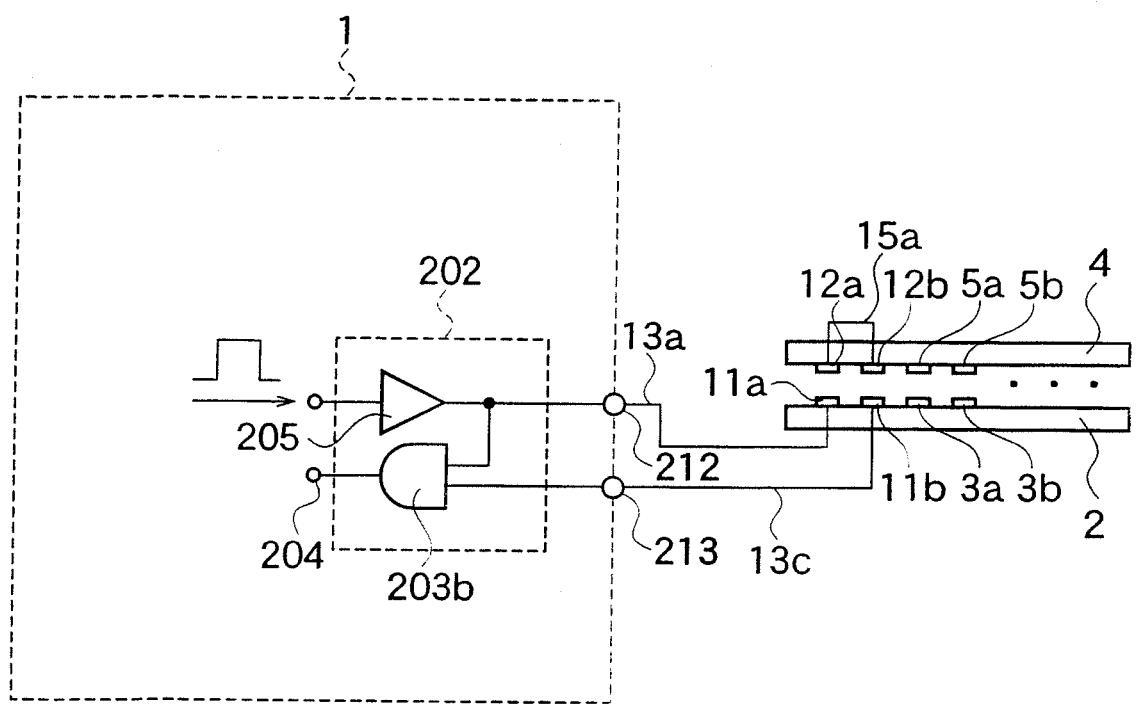
FIG. 12 is a diagram explaining a second conduction confirmation circuit integrated in a signal processing LSI of an LSI package provided with an I/F module according to a modification of the fourth embodiment of the present invention.

To overcome the problems of malfunction by noise superposition and an increase in the standby power, a conduction confirmation circuit 202 of a loop-back type shown in FIG. 12 may be integrated in the signal processing LSI 1. The conduction confirmation circuit 202 of a loop-back type, shown in FIG. 12 includes a buffer amplifier 205 configured to amplify a monitoring pulse and an AND circuit 203b configured to accept an output from the buffer amplifier 205 at the first input terminal and to accept a returning signal (loopback pulse) through a monitor wiring 13c from the interposer 2 at the second input terminal.

In FIG. 11, the output of the buffer amplifier 205 is transmitted to the first interposer-site monitoring terminal 11a through an output terminal 212 and is simultaneously delivered to the first input terminal of the AND circuit 203b The monitoring pulse which was transmitted through the output terminal 212 returns to the second input terminal of the AND circuit in the conduction confirmation circuit 202 through an input terminal 213, if gaps between a first interposer-site monitoring terminal 11a and a first module-site monitoring terminal 12a, and between a second module-site monitoring terminal 12b and a second interposer-site monitoring terminal 11b are electrically connected. By taking Boolean product operation (AND) between a returning signal (loop back pulse) through a monitor wiring 13c from the interposer 2 at the second input terminal and the monitoring pulse received at the first input terminal of the AND circuit 203b, the conduction confirmation circuit 202 of a loop back type delivers a first status signal "L" (alternatively "H") for a normal condition of the electric contact from the status signal output terminal 204.

On the contrary, in FIG. 12, because a signal (loop back pulse) returning through the monitor wiring 13c from the interposer 2 through the input terminal 213 does not exist, if electrical connection is poor between the first interposer-site monitoring terminal 11a and the first module-site monitoring terminal 12a, or between the second module-site monitoring terminal 12b and the second interposer-site monitoring terminal 11b, the conduction confirmation circuit 202 of a loop back type delivers a second status signal "H" (alternatively "L") for an abnormal condition of the electric contact (electrical connection) from the status signal output terminal 204.

In this manner, the AND circuit 203b serves as a status signal generator (comparator), which delivers a first status signal "L" (alternatively "H") for a normal condition of the electric contact from the status signal output terminal 204 and delivers a second status signal "H" (alternatively "L") for an abnormal condition of the electric contact from the status signal output terminal 204.

Also a method of transmitting a sequence of monitoring pulses periodically, and detecting the current associated with the monitoring pulses may be acceptable for the monitoring circuit.

Fifth Embodiment

A signal processing LSI 1 of an LSI package according to a fifth embodiment of the present invention, integrates an I/O controller 301 configured to block transmission and reception of signals to and from the I/F module 4 when poor contact (poor connection) is detected, in addition to the conduction confirmation circuit 202 merged in the signal processing LSI 1 of the LSI package of the fourth embodiment. Namely, when electrical connection is poor, not only the signals transmitted to the I/F module 4 cannot make sense, but also damage to the whole system may be caused by malfunction of the I/F module 4 ascribable to the signals transmitted to the I/F module 4.

Figure 13:
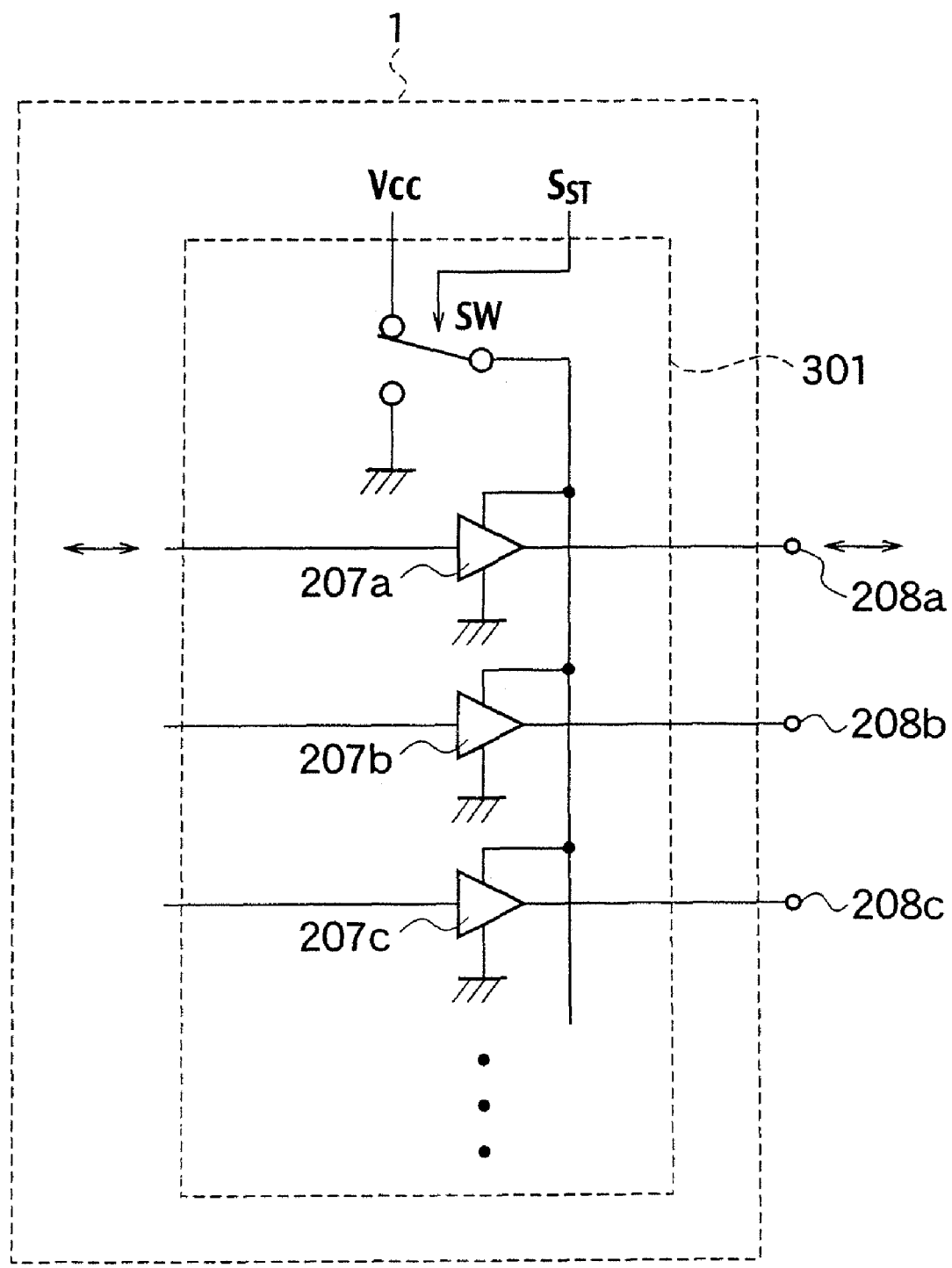
FIG. 13 is a diagram explaining a first I/O controller integrated in a signal processing LSI of an LSI package provided with an I/F module of a fifth embodiment of the present invention.

Therefore, in the signal processing LSI 1 of the LSI package of the fifth embodiment, the I/O controller 301, which can be monolithically integrated in the same chip with the conduction confirmation circuit 202, will be explained. The I/O controller 301 can perform a fail-safe function of quickly blocking the transmission and reception of signals to and from the I/F module 4, when poor contact is detected, alarming the occurrence of poor contact to the system of the LSI package, and storing temporally system data into predetermined memory to protect damages, etc., using an output signal delivered from the status signal output terminal 204 in the conduction confirmation circuit 202 integrated in the signal processing LSI 1, which is already explained in the fourth embodiment Such a circuit as shown in FIG. 13, for example, having a function of blocking transmission and reception of signals to and from the I/F module 4 by decreasing supply voltage of output buffer circuits below a required value for the operation of the output buffer circuits, may be adopted for the I/O controller 301. The I/O controller 301 shown in FIG. 13 has a plurality of input/output (I/O) buffers 207a, 207b, 207c, . . . each of which is connected to the corresponding I/O terminals 208a, 208b, 208c, . . . . The I/O buffers 207a, 207b, 207c, . . . are connected in parallel between a power supply switch SW and the ground respectively. The power supply switch SW shown in FIG. 13 is an equivalent circuit represented by a symbol and various switching elements such as semiconductor active elements are acceptable for the power supply switch SW actually.

The power supply switch SW of the I/O controller 301 connects power supply terminals of the I/O buffers 207a, 207b, 207c, . . . to a terminal of supply voltage Vcc for operation of signal I/O buffering, alternatively to a terminal of ground for prohibiting the operation of the I/O buffers 207a, 207b, 207c, . . . , corresponding to the status signals $S_{ST}$ from the status signal output terminal 204 of the conduction confirmation circuit 202, which was explained in the fourth embodiment.

Figure 14:
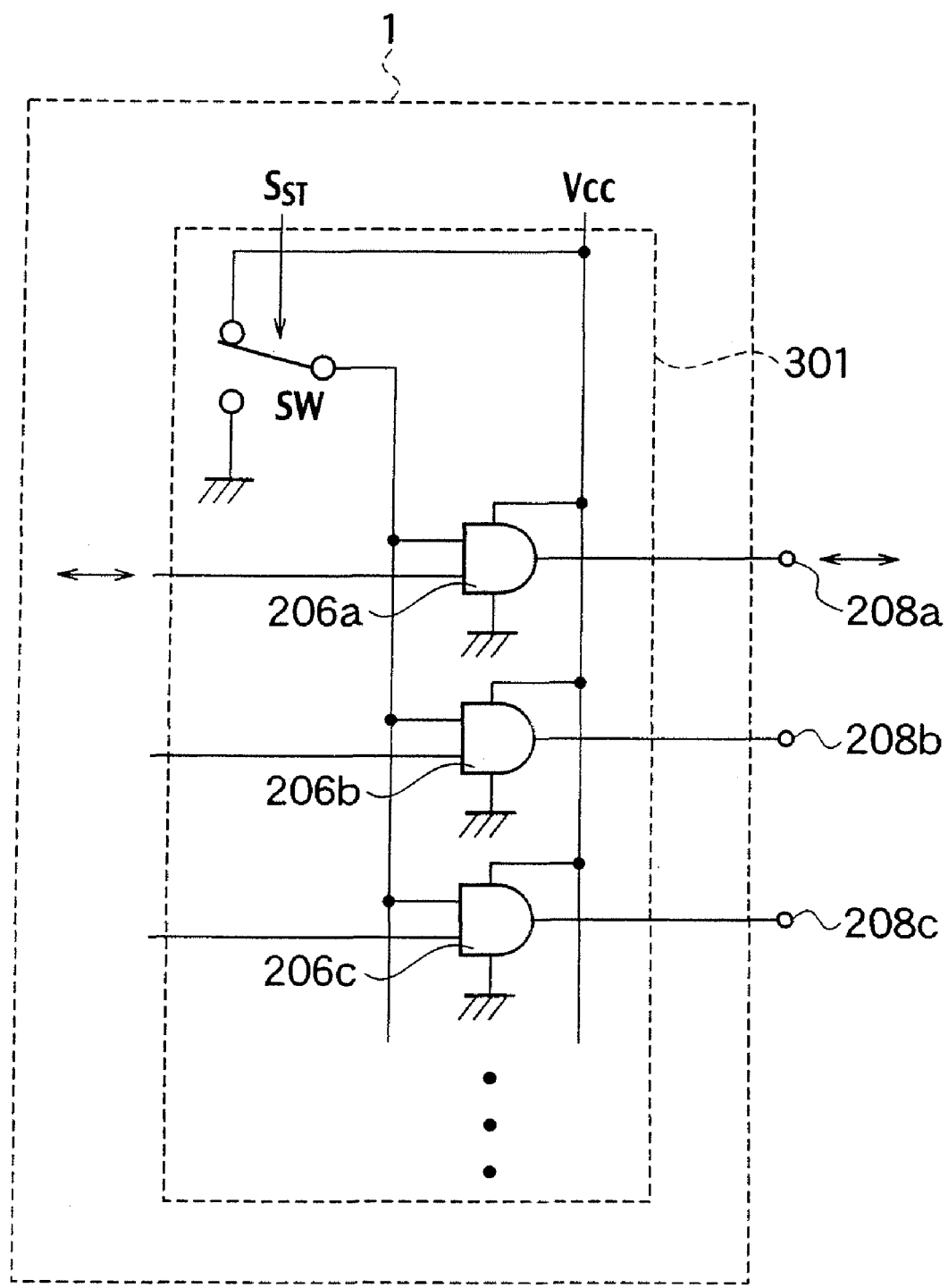
FIG. 14 is a diagram explaining a second I/O controller integrated in a signal processing LSI of an LSI package provided with an I/F module according to a modification of the fifth embodiment of the present invention.

Alternatively, as shown in FIG. 14, the I/O controller 301 configured to block transmission and reception of signals by gate circuits (combinational logic elements) implementing the output buffer circuits may be acceptable for the switch. The I/O controller 301 shown in FIG. 14 has a plurality of AND circuits 206a, 206b, 206c, . . . as the I/O buffers, each of which has two input terminals and an output terminal which is connected to the corresponding I/O terminals 208a, 208b, 208c, . . . . The first input terminal of each of the AND circuits 206a, 206b, 206c, . . . is connected to the power supply switch SW respectively. Similar to FIG. 13, the power supply switch SW shown in FIG. 14 is an equivalent circuit represented by a symbol and various switching elements such as semiconductor active elements are acceptable for the power supply switch SW actually. The second input terminal of each of the AND circuits 206a, 206b, 206c, . . . is connected to an internal circuit of the signal processing LSI 1. The power supply switch SW of the I/O controller 301 connects one of the input terminals of the AND circuits 206a, 206b, 206c, . . . to a terminal of supply voltage Vcc for feeding "H" so as to enable operation of signal I/O buffering, alternatively to a terminal of ground for feeding "L" so as to disenable the operation of the I/O buffers 206a, 206b, 207c, . . . , corresponding to the status signals $S_{ST}$ from the status signal output terminal 204 of the conduction confirmation circuit 202.

Other Embodiment

Various modifications will become possible for those skilled in the art after receiving the teachings of the present disclosure without departing from the scope thereof. For example, the signal processing LSI 1 mounted on the interposer 2, is not limited to the signal processing LSIs 1 which are explained in the first to fifth embodiments. There is no limitation on the signal processing LSI 1 to be mounted on the interposer 2, as long as the signal processing LSI 1 can facilitate operation of the I/F module 4, and the I/F module 4 can facilitate operation of the signal processing LSIs 1. Although, in FIGS. 1, 2 and 6 etc, configurations are in which a single signal processing LSI 1 is mounted on the interposer 2, another configuration whereby a plurality of signal processing LSIs 1 are mounted on a same interposer 2 may be acceptable for the LSI package.

When a plurality of signal processing LSIs 1 are mounted on the interposer 2, in such a configuration with a plurality of I/F modules 4, the number of the I/F modules 4 corresponds to the number of the signal processing LSIs, is adapted to each of the signal processing LSIs. Alternatively, the plurality of signal processing LSIs 1 can be accommodated in a single I/F module 4, in which a plurality of concavities or openings are established, and the number of the concavities or openings corresponds to the number of signal processing LSIs. And when a plurality of signal processing LSIs 1 are mounted on the interposer 2, the conduction confirmation circuit 202 explained in the forth embodiment and the I/O controller 301 explained in the fifth embodiment can be integrated in different LSI chips.

In addition, in the fourth embodiment, the conduction confirmation circuit 202 of the DC conductive type shown in FIG. 11 and the conduction confirmation circuit 202 of the loop-back type are assumed to be integrated monolithically in the signal processing LSI 1. However, the conduction confirmation circuits 202 of the DC conductive type and loop-back type can be implemented by hybrid integrated circuits using a plurality of circuit components $X_{ij}$ ("i" and "j" are integers respectively, each representing a position in a matrix) arranged on the printed wiring board 8, as shown in FIG. 1. Furthermore, to alarm a poor electrical contact, a red LED attached on to the printed wiring board 8 can be employed, using an output signal delivered from the status signal output terminal 204 of the conduction confirmation circuit 202 shown in FIG. 11 or FIG. 12.

Further, for a poor electrical contact, it is effective to add a blocking function of signals to and from the I/F module 4 in the first to fifth embodiments, similar to the blocking function of signals to and from the signal processing LSIs 1, mentioned in the fifth embodiment. Namely, the addition of the blocking function has effectiveness in preventing malfunction of the other I/F module which is connected ahead of the transmission line and an unexpected operation of the other I/F module caused by abnormal data. To establish the blocking function of signals to and from the I/F module 4, the I/O controller 301 explained in the fifth embodiment can be mounted or integrated in the I/F module 4.

Besides, technical features such as configurations, materials and methods of arrangement of electric joints, monitoring terminals are fundamentally not limited to the disclosure in the first to fifth embodiments, because the LSI packages disclosed in the first to fifth embodiments are mere examples. Thus, the present invention of course includes various embodiments and modifications and the like which are not detailed above. Therefore, the scope of the present invention will be defined in the following claims.

What is claimed is:

1. An interface module included in an LSI package, the LSI package further including a signal processing LSI and an interposer mounting the signal processing LSI, the interface module having a transmission line configured to establish an external interconnection of signal, which is transmitted through the interposer, the interface module comprising:

a plurality of interposer-connecting terminals configured to mechanically and electrically connect with a plurality of module-connecting terminals provided on the interposer, part of the interposer-connecting terminals are assigned as monitoring terminals, through which a monitoring current to confirm electrical connection between the signal processing LSI and the interface module flows; and an input/output controller, which controls transmission and reception of signals to and from external interconnection, by blocking the signals when poor connection is detected between the interposer-connecting terminals and the module-connecting terminals.

2. The interface module of claim 1, wherein a plurality of separated areas are assigned on the interface module, the monitoring terminals are disposed respectively in the separated areas, so as to provide a plurality of monitoring circuits.

3. An interface module, included in an LSI package, the LSI package further including a signal processing LSI and an interposer mounting the signal processing LSI, the interface module having a transmission line configured to establish an external interconnection of signal, which is transmitted through the interposer, the interface module comprising:

a plurality of interposer-connecting terminals configured to mechanically and electrically connect with a plurality of module-connecting terminals provided on the interposer, part of the interposer-connecting terminals are assigned as monitoring terminals, through which a monitoring current to confirm electrical connection between the signal processing LSI and the interface module flows, wherein at least one pair of the interposer-connecting terminals are mutually short-circuited as the second monitoring terminals serving as elements of a monitoring circuit, which monitors the electrical connection between the signal processing LSI and the interface module.

* * * * *